(12) United States Patent
Nakagawa

(10) Patent No.: US 12,119,299 B2
(45) Date of Patent: Oct. 15, 2024

(54) SEMICONDUCTOR DEVICE AND MANUFACTURING METHOD FOR THE SAME

(71) Applicant: FUJI ELECTRIC CO., LTD., Kawasaki (JP)

(72) Inventor: Sho Nakagawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 190 days.

(21) Appl. No.: 17/182,447

(22) Filed: Feb. 23, 2021

(65) Prior Publication Data

US 2021/0327810 A1     Oct. 21, 2021

(30) Foreign Application Priority Data

Apr. 17, 2020   (JP) .................................. 2020-74238

(51) Int. Cl.
| | |
|---|---|
| *H01L 23/52* | (2006.01) |
| *H01L 21/66* | (2006.01) |
| *H01L 21/768* | (2006.01) |
| *H01L 23/522* | (2006.01) |
| *H01L 23/525* | (2006.01) |

(Continued)

(52) U.S. Cl.
CPC .... *H01L 23/5256* (2013.01); *H01L 21/76895* (2013.01); *H01L 22/14* (2013.01); *H01L 22/32* (2013.01); *H01L 23/5226* (2013.01); *H01L 29/866* (2013.01); *H03K 17/74* (2013.01)

(58) Field of Classification Search
CPC ......... H01L 2924/00; H01L 2924/0002; H01L 23/5256; H01L 2224/48091; H01L 2924/00014
See application file for complete search history.

(56) References Cited

U.S. PATENT DOCUMENTS

| | | | |
|---|---|---|---|
| 9,196,585 B2 | 11/2015 | Katakura | |
| 2005/0285224 A1* | 12/2005 | Tsutsui | ................ H01L 23/5256 257/E23.149 |
| 2011/0248379 A1 | 10/2011 | Yonezu et al. | |

FOREIGN PATENT DOCUMENTS

| | | |
|---|---|---|
| JP | 2001-291830 A | 10/2001 |
| JP | 2008288280 A | 11/2008 |
| JP | 2011222691 A | 11/2011 |

(Continued)

OTHER PUBLICATIONS

Nakagawa et al., "One-Chip Linear Control IPS, "F5106H"", Fuji Electric Review, vol. 59, No. 4, 2013, pp. 251-254 (5 pages total).

(Continued)

*Primary Examiner* — Tony Tran

(57) ABSTRACT

A method for manufacturing a semiconductor device includes: forming a trimming element inside or over a semiconductor substrate; forming an insulating film on the trimming element; forming, on the insulating film, a first wiring layer connected to one end of the trimming element via a first contact region penetrating the insulating film; forming, on the insulating film, a second wiring layer connected to another end of the trimming element via a second contact region penetrating the insulating film; trimming the trimming element; and examining an insulated state between the semiconductor substrate and either the first wiring layer or the second wiring layer after the trimming.

6 Claims, 16 Drawing Sheets

(51) Int. Cl.
*H01L 29/866* (2006.01)
*H03K 17/74* (2006.01)

(56) References Cited

FOREIGN PATENT DOCUMENTS

| | | |
|---|---|---|
| JP | 2013110326 A | 6/2013 |
| JP | 2015-109305 A | 6/2015 |
| WO | 2009104343 A1 | 8/2009 |

OTHER PUBLICATIONS

Japanese Office Action dated Dec. 19, 2023 for corresponding Japanese Application No. 2020-074238.

* cited by examiner

SEMICONDUCTOR DEVICE AND MANUFACTURING METHOD FOR THE SAME

CROSS-REFERENCE TO RELATED APPLICATION

This application claims benefit of priority under 35 USC 119 based on Japanese Patent Application No. 2020-074238 filed on Apr. 17, 2020, the entire contents of which are incorporated by reference herein.

BACKGROUND

1. Field of the Invention

The present invention relates to a semiconductor device including a trimming circuit and a manufacturing method for the same.

2. Description of the Related Art

Trimming circuits are used for switching functions or adjusting properties of semiconductor integrated circuits (ICs) (refer to JP 2013-110326 A, WO 2009/104343, JP 2011-222691 A, and JP 2008-288280 A). Upon trimming, electrical stress is externally applied to a trimming element in a trimming circuit so as to logically inverse the trimming element.

For example, when the trimming element is a fusible resistor, the fusible resistor is subjected to blowout so that the fusible resistor is shifted from a short-circuit state to an open state between the respective terminals. When the trimming element is a Zener zap diode, short-circuit destruction is caused at a p-n junction with avalanche current so that the Zener zap diode is shifted from the open state to the short-circuit state between the respective terminals.

The trimming, which applies the electrical stress to the trimming element, may cause damage to a circumference of the trimming element. When the damage is as high as a level that the IC immediately stops the operation, the damage can be detected in a following examination during the manufacturing process, so as to reject inferior products.

When the damage is as high as a potential level that the IC is determined to be in normal operation, the damage cannot be detected in a following examination during the manufacturing process. The damage having such a potential level caused at the circumference of the trimming element may be revealed during the use in the market, decreasing the quality of products accordingly.

SUMMARY

In view of the foregoing problems, the present invention provides a semiconductor device and a manufacturing method for the same capable of improving a quality while rejecting, at a point of examination during a manufacturing process, an inferior product having damage at a circumference of a trimming element caused during trimming.

An aspect of the present invention provides a semiconductor device including: a trimming element buried in or provided over a semiconductor substrate; an insulating film provided on the trimming element; a first wiring layer provided on the insulating film and connected to one end of the trimming element via a first contact region penetrating the insulating film; a second wiring layer provided on the insulating film and connected to another end of the trimming element via a second contact region penetrating the insulating film; and an auxiliary wiring layer provided on the insulating film at a position overlapping with a middle part of the trimming element.

Another aspect of the present invention provides a semiconductor device including: a trimming element buried in or provided over a semiconductor substrate; an insulating film provided on the trimming element; a first wiring layer provided on the insulating film and connected to one end of the trimming element via a first contact region penetrating the insulating film; a second wiring layer provided on the insulating film and connected to another end of the trimming element via a second contact region penetrating the insulating film; and a pad for testing connected to the semiconductor substrate.

Further aspect of the present invention provides a method for manufacturing a semiconductor device, including: forming a trimming element inside or over a semiconductor substrate; forming an insulating film on the trimming element; forming, on the insulating film, a first wiring layer connected to one end of the trimming element via a first contact region penetrating the insulating film; forming, on the insulating film, a second wiring layer connected to another end of the trimming element via a second contact region penetrating the insulating film; trimming the trimming element; and examining an insulated state between the semiconductor substrate and either the first wiring layer or the second wiring layer after the trimming.

DETAILED DESCRIPTION

Figure 1:
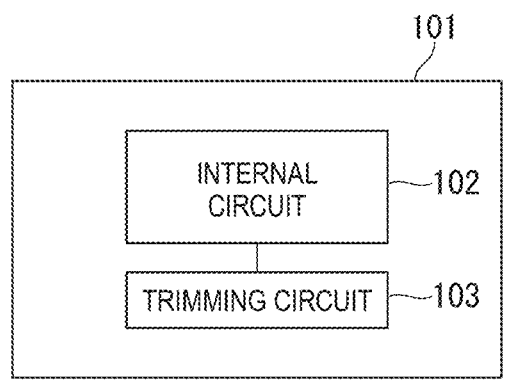
FIG. 1 is a plan view illustrating a semiconductor device according to a first embodiment of the present invention.

With reference to the Drawings, first to sixth embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first to sixth embodiments described below merely illustrate schematically devices and methods for specifying and giving shapes to the technical idea of the present invention, and the span of the technical idea is not limited to materials, shapes, structures, and relative positions of elements described herein.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an n-type and a second conductivity-type is a p-type. However, the relationship of the conductivity-types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, it is technically and logically obvious that the members and the regions that are limited by adding "first conductivity type" and "second conductivity type" in the following description indicate the members and the regions formed of semiconductor materials without particular obvious limitations.

First Embodiment

<Semiconductor Device>

A semiconductor device 101 according to a first embodiment includes an internal circuit 102 and a trimming circuit 103 connected to the internal circuit 102 on the same substrate, as illustrated in FIG. 1. The internal circuit 102 may include a vertical transistor such as an insulated gate bipolar transistor (IGBT), and a control circuit that controls the vertical transistor. The trimming circuit 103 regulates a fluctuation in circuit property of the internal circuit 102.

Figure 2:
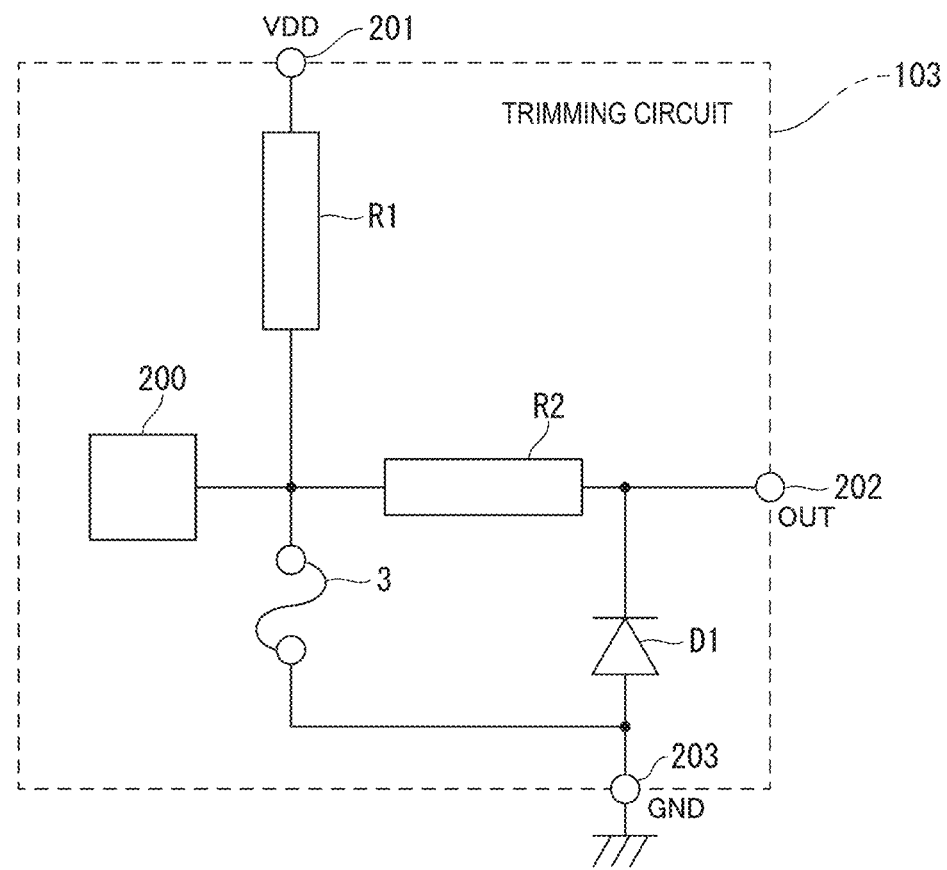
FIG. 2 is a circuit diagram illustrating a trimming circuit according to the first embodiment.

As illustrated in FIG. 2, the trimming circuit 103 includes a fusible resistor 3 implementing a trimming element. The fusible resistor 3 used may be a polysilicon resistor made of a polysilicon film. One end of the fusible resistor 3 is connected to a pad for trimming 200, one end of a protection resistor R1, and one end of a protection resistor R2.

The other end of the protection resistor R1 is connected to a power supply terminal 201. A first potential (a power supply potential) VDD is applied to the power supply terminal 201 from an internal power supply, for example. A resistance value of the protection resistor R1 is higher than a resistance value of the protection resistor R2. Instead of the protection resistor R1, a depletion-mode (normally-ON) MOS transistor may be used.

The other end of the fusible resistor 3 is connected to an anode of a protection diode D1 and a ground terminal 203. A second potential (a ground potential) GND is applied to the ground terminal 203. The protection diode D1 is a Zener diode. A breakdown voltage Vz of the protection diode D1 is about 5 volts, for example. A cathode of the protection diode D1 is connected to the other end of the protection resistor R2 and an output terminal 202. An output value OUT is output to the outside via the output terminal 202.

The fusible resistor 3 before trimming is in a short-circuit state between the respective terminals, and a low (L) level voltage (such as zero volts) is output as the output value OUT from the trimming circuit 103. During the trimming, a potential for trimming is applied to the pad for trimming 200 from an external power supply, for example, and the fusible resistor 3 is subjected to blowout by Joule heat. The fusible resistor 3 after the trimming is shifted from the short-circuit state to an open state between the respective terminals. The output value OUT of the trimming circuit 103 is logically inversed so as to output a high (H) level voltage (such as five volts).

Figure 3:
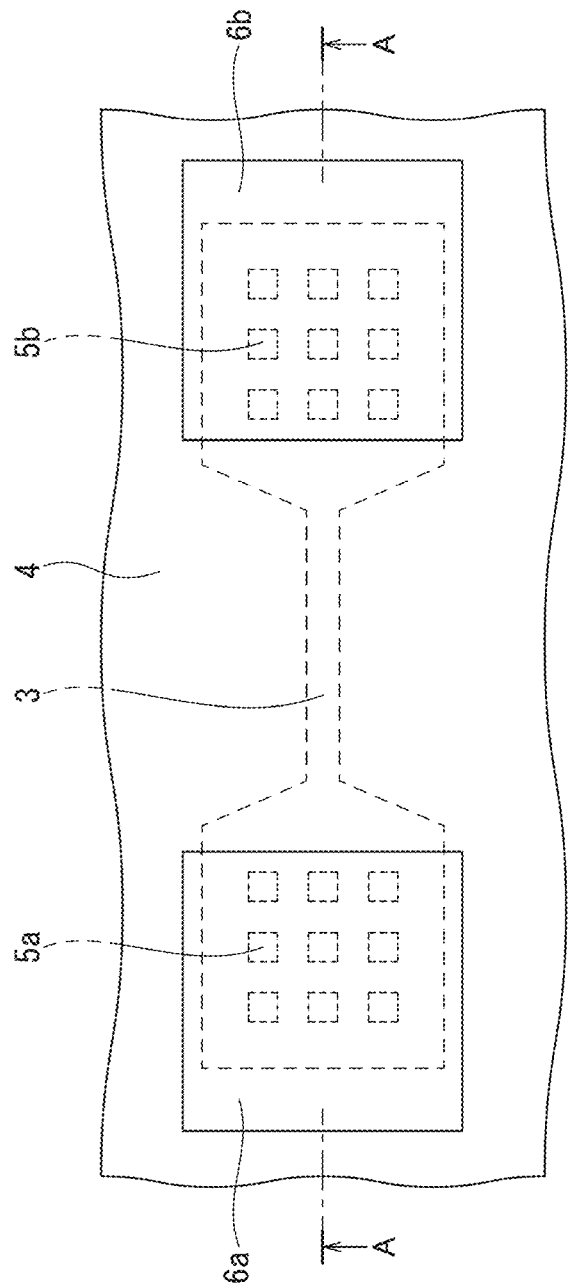
FIG. 3 is a plan view illustrating the semiconductor device according to the first embodiment before trimming.
Figure 4:
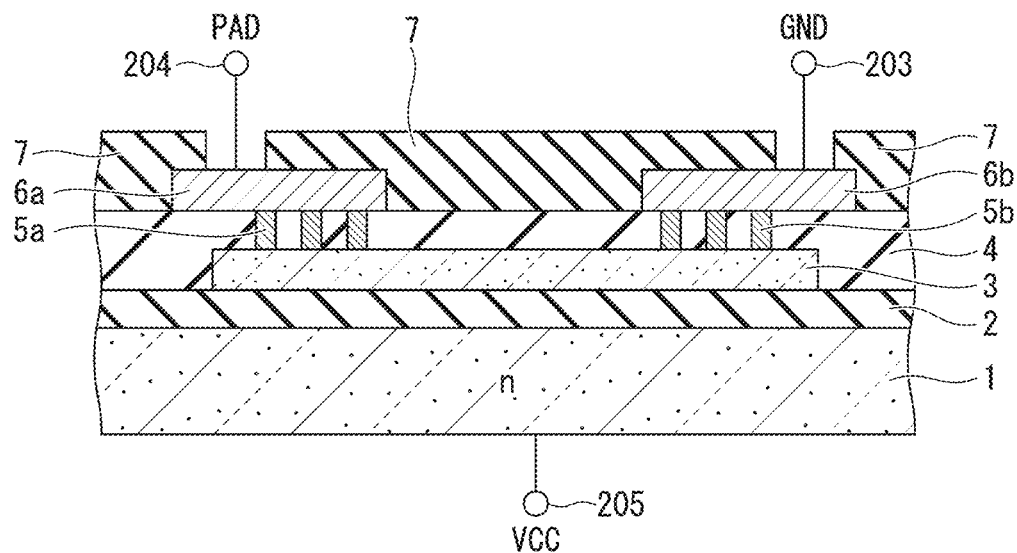
FIG. 4 is a cross-sectional view illustrating the semiconductor device according to the first embodiment before the trimming.

FIG. 3 is a plan view of a circumference of the fusible resistor 3 illustrated in FIG. 2, and FIG. 4 is a cross-sectional view as viewed from direction A-A in FIG. 3. As illustrated in FIG. 3 and FIG. 4, the semiconductor device according to the first embodiment includes a semiconductor substrate 1 of a first conductivity type (n-type), an insulating film (a field insulating film) 2 deposited on the semiconductor substrate 1, and the fusible resistor 3 provided on the field insulating film 2.

A substrate terminal 205 to which a third potential (a reference potential) Vcc (about 13 volts, for example) is applied is connected to the semiconductor substrate 1. A semiconductor wafer made of silicon (Si) may be used for the semiconductor substrate 1 as a base material, for example. Although not illustrated, various kinds of elements, such as an IGBT, a MOS transistor, and a diode, implementing each of the internal circuit 102 and the trimming circuit 103 illustrated in FIG. 1 are provided inside and over the semiconductor substrate 1, in addition to the fusible resistor 3.

As illustrated in FIG. 3, the fusible resistor 3 has a middle part that is narrower than the respective end parts and is to be blown out upon the trimming. While the fusible resistor 3 has a symmetrical planar pattern as illustrated in FIG. 3, the fusible resistor 3 may have an asymmetrical planar pattern. The planar pattern of the fusible resistor 3 may be determined as appropriate.

As illustrated in FIG. 3 and FIG. 4, an insulating film (an interlayer insulating film) 4 is deposited on the fusible resistor 3. A first wiring layer 6a is provided on the interlayer insulating film 4 so as to overlap with one end of the fusible resistor 3. The first wiring layer 6a is electrically connected to the one end of the fusible resistor 3 via a first contact region 5a penetrating the interlayer insulating film 4. The first wiring layer 6a is connected to a pad terminal 204. The pad terminal 204 is connected to the pad for trimming 200 illustrated in FIG. 2, and a voltage PAD is applied to the pad terminal 204 via the pad for trimming 200.

A second wiring layer 6b is provided on the interlayer insulating film 4 so as to overlap with the other end of the fusible resistor 3. The second wiring layer 6b is electrically connected to the other end of the fusible resistor 3 via a second contact region 5b penetrating the interlayer insulating film 4. The second wiring layer 6b is connected to the ground terminal 203 to which the ground potential GND is applied. An insulating film (an insulating passivation film) 7 is deposited on the first wiring layer 6a and the second wiring layer 6b. FIG. 3 omits the illustration of the insulating passivation film 7 illustrated in FIG. 4.

A material used for the fusible resistor 3 may be heavily-doped polysilicon, polycide, or metallic material. Examples of silicide films implementing the polycide include titanium silicide ($TiSi_2$), cobalt silicide ($CoSi_2$), and tungsten silicide ($WSi_2$). Other possible examples implementing the polycide include tantalum silicide ($TaSi_2$), molybdenum silicide (MoSi), and nickel silicide (NiSi). Examples of metallic materials include aluminum (Al), gold (Au), copper (Co), and refractory metals such as platinum (Pt), titanium (Ti), and tungsten (W).

A material used for the first wiring layer 6a, the second wiring layer 6b, the first contact region 5a, and the second contact region 5b may be metal such as aluminum (Al), copper (Cu), and tungsten (W). The material used for the first wiring layer 6a and the second wiring layer 6b and the material used for the first contact region 5a and the second contact region 5b may be the same, or may differ from each other. The number and the arrangement positions of the first contact region 5a and the second contact region 5b may be determined as appropriate.

A material used for the field insulating film 2, the interlayer insulating film 4, and the insulating passivation film 7 may be a silicon oxide film (a SiO2 film), a silicon nitride film (a $Si_3N_4$ film), an insulating film deposited by a chemical vapor deposition (CVD) method using gas containing an organic silicon compound such as tetraethoxysilane (TEOS) (a TEOS film), a silicon oxide film without containing phosphorus (P) or boron (B) (a SiO2 film) which is referred to as a non-doped silicate glass film (a NSG film), a phosphosilicate glass film (a PSG film), a borosilicate glass film (a BSG film), a single-layer film of a borophosphosilicate glass film (a BPSG film) or a silicon nitride ($Si_3N_4$) film, or a composite film of any of the above films combined together.

Figure 5:
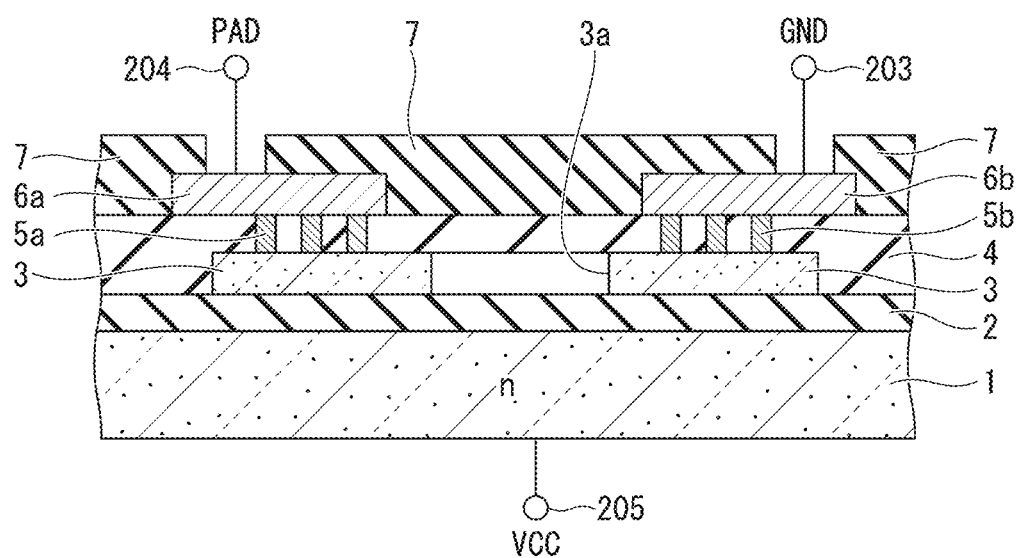
FIG. 5 is a cross-sectional view illustrating the semiconductor device according to the first embodiment after the trimming.

As illustrated in FIG. 5, upon the trimming of the fusible resistor 3, a voltage for trimming is applied as a voltage PAD via the pad for trimming 200 and the pad terminal 204 from an external power supply, for example, so that the middle part of the fusible resistor 3 is blown out by Joule heat to be provided with an opening 3a. The fusible resistor 3 is then shifted from the short-circuit state to the open state between the respective terminals.

After the trimming, the fusible resistor 3 is determined whether to be in the open state between the respective terminals. In particular, a voltage for testing lower than the voltage for trimming is applied as a potential PAD via the pad for trimming 200 and the pad terminal 204 to confirm that a current does not flow between the pad terminal 204 and the ground terminal 205, so as to confirm that the fusible resistor 3 is in the open state between the respective terminals.

However, potential damage could be caused at the circumference of the fusible resistor 3 even after the open state is confirmed between the respective terminals of the fusible resistor 3. For example, a part of the polysilicon included in the fusible resistor 3 is sometimes exposed on the top surface of the interlayer insulating film 4, or the field insulating film 2 is sometimes cracked to lead to a short circuit between the fusible resistor 3 and the semiconductor substrate 1.

Figure 6:
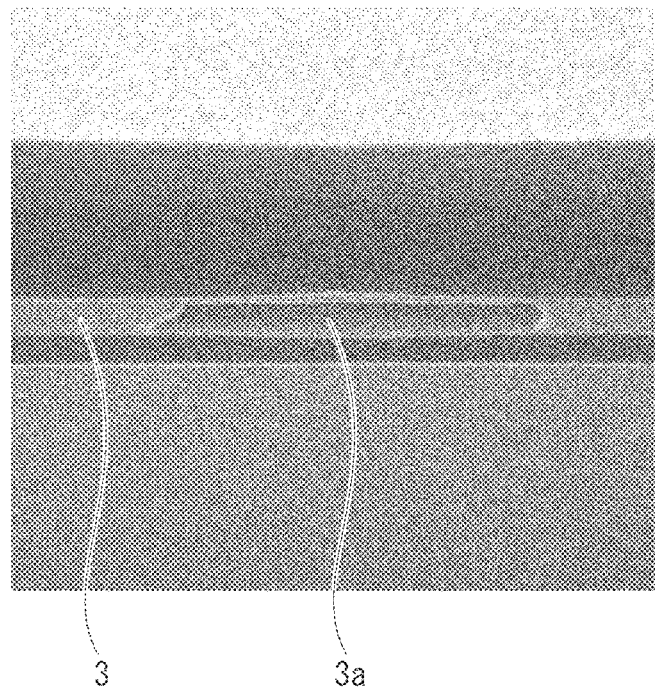
FIG. 6 is a cross-sectional image of the semiconductor device according to the first embodiment having no damage at a circumference of a trimming element after the trimming.
Figure 7:
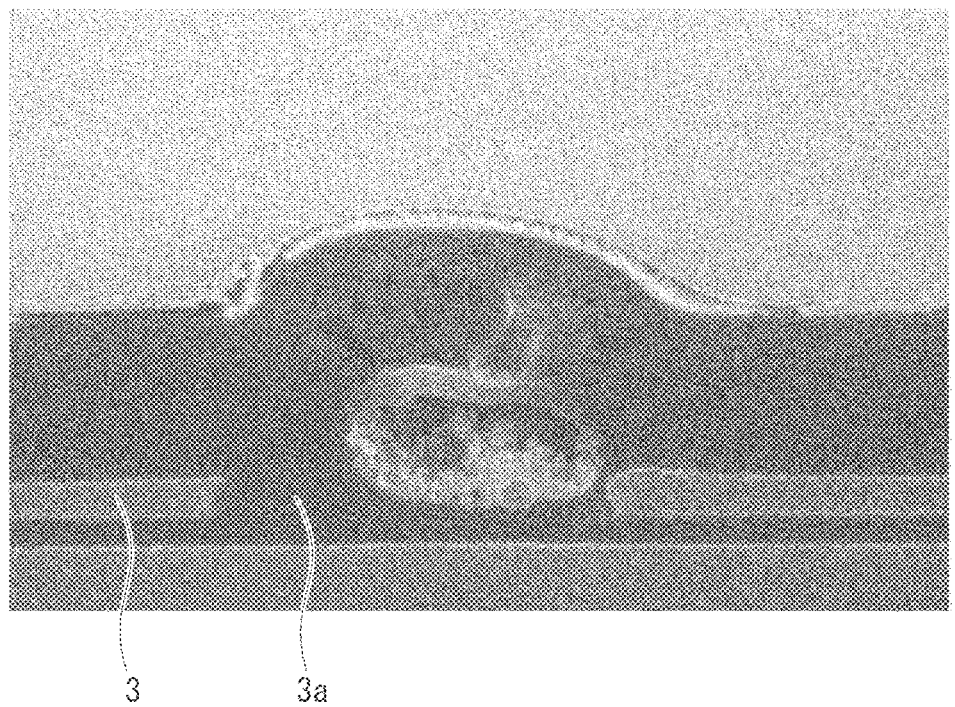
FIG. 7 is a cross-sectional image of the semiconductor device according to the first embodiment having been damaged at the circumference of the trimming element after the trimming.

FIG. 6 is a cross-sectional image of the semiconductor device according to the first embodiment having no damage at the circumference of the fusible resistor 3 after the trimming. FIG. 7 is a cross-sectional image of the semiconductor device according to the first embodiment having been damaged at the circumference of the fusible resistor 3 after the trimming. As illustrated in FIG. 7, if the damage is caused at the circumference of the fusible resistor 3, a part of the polysilicon included in the fusible resistor 3 may be exposed on the top surface of the interlayer insulating film 4, or a short circuit may be caused between the fusible resistor 3 and the semiconductor substrate 1.

The potential damage at the circumference of the fusible resistor 3 may have an influence on the operations or the durability afterward, resulting in a reduction in long-term reliability. The first embodiment detects such potential damage caused at the circumference of the fusible resistor 3.

Figure 8:
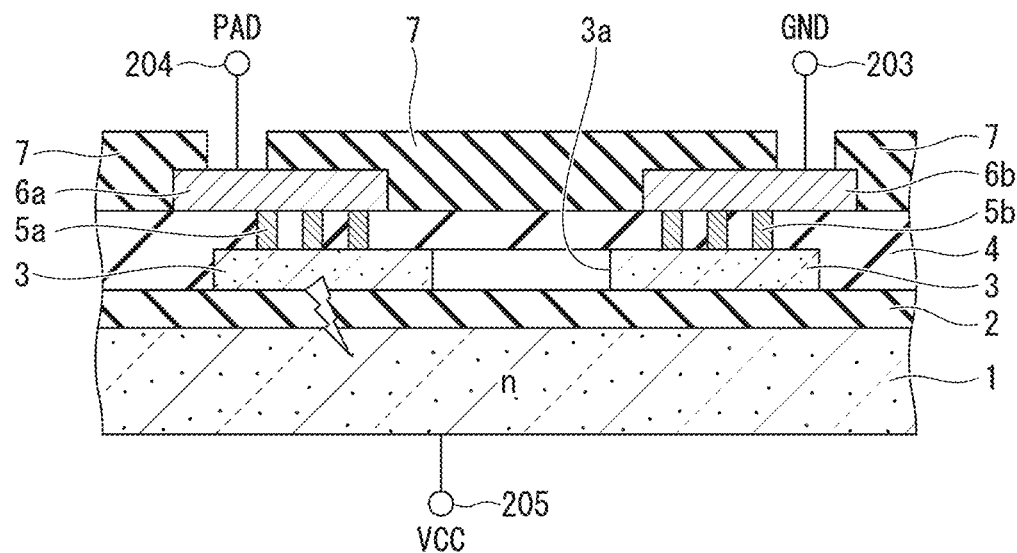
FIG. 8 is a cross-sectional view of the semiconductor device according to the first embodiment during determining a trimming abnormality.

A method for detecting potential damage at the circumference of the fusible resistor 3 includes a process of applying a voltage between the substrate terminal 205 and the pad terminal 204, and measuring a leak current between the substrate terminal 205 and the pad terminal 204 with an ammeter (not illustrated), for example, so as to examine an insulated state between the substrate terminal 205 and the pad terminal 204, as illustrated in FIG. 8. When the current does not flow between the substrate terminal 205 and the pad terminal 204, the semiconductor device is determined to be a well-made product (normal). When the current flows between the substrate terminal 205 and the pad terminal 204, the semiconductor device is determined to be an inferior product (abnormal) since a short circuit is caused between one end of the fusible resistor 3 toward the pad terminal 204 and the semiconductor substrate 1 because of damage such as cracks caused in the field insulating film 2 toward the pad terminal 204.

Figure 9:
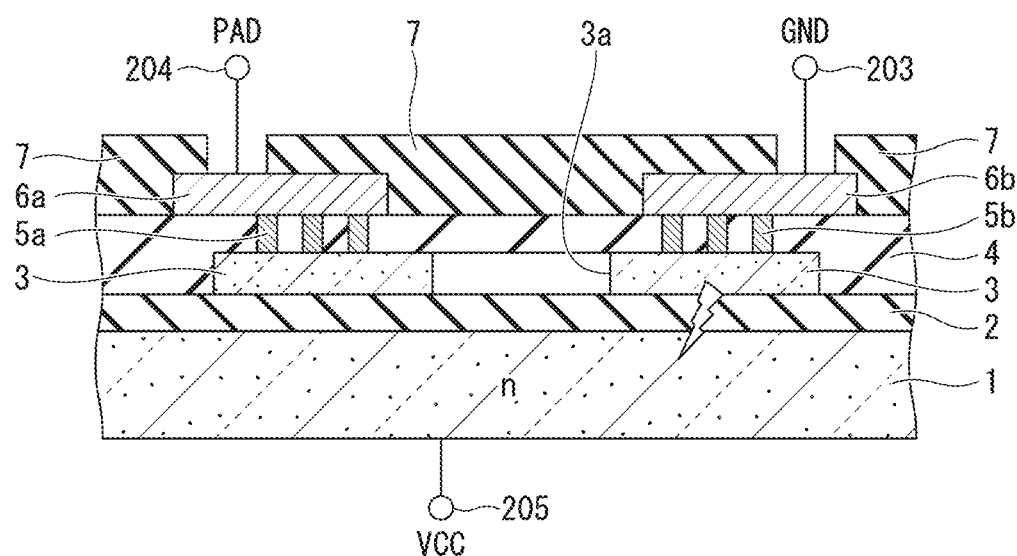
FIG. 9 is another cross-sectional view of the semiconductor device according to the first embodiment during determining the trimming abnormality.

Further, as illustrated in FIG. 9, a voltage is applied between the substrate terminal 205 and the ground terminal 203, and a leak current between the substrate terminal 205 and the ground terminal 203 is measured, so as to examine an insulated state between the substrate terminal 205 and the ground terminal 203. When the current does not flow between the substrate terminal 205 and the ground terminal 203, the semiconductor device is determined to be a well-made product (normal). When the current flows between the substrate terminal 205 and the ground terminal 203, the semiconductor device is determined to be an inferior product (abnormal) since a short circuit is caused between the other end of the fusible resistor 3 toward the ground terminal 203 and the semiconductor substrate 1 because of damage such as cracks caused in the field insulating film 2 toward the ground terminal 203.

<Method for Manufacturing Semiconductor Device>

An example of a method for manufacturing the semiconductor device according to the first embodiment is described below. First, the internal circuit 102 and the trimming circuit 103 as illustrated in FIG. 1 are formed by a process used for typical semiconductors. Upon forming the trimming circuit 103, the field insulating film 2 is first formed on the semiconductor substrate 1 by a thermal oxidation method or a CVD method, for example, as illustrated in FIG. 4. A polysilicon film is then deposited on the field insulating film 2 by a CVD method or the like, and a part of the polysilicon film is selectively removed by photolithography and etching, for example, so as to form the fusible resistor 3 on the field insulating film 2.

Next, the interlayer insulating film 4 is formed on the fusible resistor 3 by a CVD method or the like, and penetration holes are formed in the interlayer insulating film 4 by photolithography and etching. The penetration holes of the interlayer insulating film 4 are filled with a metallic film by a sputtering method or a vapor deposition method, for example. A part of the metallic film is then removed by photolithography and etching, so as to form the first contact region 5a and the second contact region 5b buried in the penetration holes of the interlayer insulating film 4, and further form the first wiring layer 6a and the second wiring layer 6b on the interlayer insulating film 4. The pad for trimming 200 illustrated in FIG. 2 may be simultaneously formed from a part of the metallic film. The insulating passivation film 7 is then deposited on the first wiring layer 6a and the second wiring layer 6b by a CVD method or the like. The above steps thus provide the semiconductor device according to the first embodiment having a structure before trimming, as illustrated in FIG. 3 and FIG. 4.

Next, the trimming process is executed. The trimming process is described in detail below with reference to the flowchart illustrated in FIG. 10. In step S1, an initial property of the internal circuit 102 is determined whether to fulfil a predetermined threshold. In step S2, the necessity of performing the trimming is determined in accordance with the determination result of the initial property of the internal circuit 102. When the initial property of the internal circuit 102 fulfils the predetermined threshold, and the trimming is thus determined not to be necessary, the process proceeds to step S8 to execute the following step. When the initial property of the internal circuit 102 does not fulfil the predetermined threshold, and the trimming is thus determined to be necessary in step S2, the process proceeds to step S3.

In step S3, the trimming is performed on the fusible resistor 3. For example, a voltage for trimming is applied as the voltage PAD via the pad for trimming 200 and the pad terminal 204 from an external power supply or the like, so that the middle part of the fusible resistor 3 is blown out by Joule heat so as to be provided with the opening 3a. The fusible resistor 3 is then shifted from the short-circuit state to the open state between the respective terminals.

In step S4, a property value of the internal circuit 102 is confirmed after the trimming of the fusible resistor 3. In step S5, when the property value of the internal circuit 102 does not fulfill a threshold, the product is determined to be inferior, and the process proceeds to step S6 to reject the product. When the property value of the internal circuit 102 fulfills the threshold in step S5, the product is determined to have a good quality, and the process proceeds to step S7 to then determine the presence or absence of trimming abnormality.

The determination of the presence or absence of the trimming abnormality in step S7 is described in more detail below with reference to the flowchart illustrated in FIG. 11. In step S71, the voltage for testing lower than the voltage for trimming is applied as the potential PAD via the pad for trimming 200 and the pad terminal 204 to measure a current between the pad terminal 204 and the ground terminal 203 so as to determine whether the fusible resistor 3 is in the open state between the respective terminals. When the current flows between the pad terminal 204 and the ground terminal 203, and the fusible terminal 3 is determined not to be in the open state between the respective terminals, the product is determined to be inferior, and the process proceeds to step S6 to reject the product. When the current does not flow between the pad terminal 204 and the ground terminal 203, and the fusible terminal 3 is determined be in the open state between the respective terminals in step S71, the process then proceeds to step S72.

In step S72, the presence or absence of potential damage at the circumference of the fusible resistor 3 is detected. In particular, a voltage for testing lower than the voltage for trimming is applied between the substrate terminal 205 and the pad terminal 204, and a leak current between the substrate terminal 205 and the pad terminal 204 is measured, so as to examine an insulated state between the substrate terminal 205 and the pad terminal 204. Further, as illustrated in FIG. 9, a voltage is applied between the substrate terminal 205 and the ground terminal 203, and a leak current between the substrate terminal 205 and the ground terminal 203 is measured, so as to examine an insulated state between the substrate terminal 205 and the ground terminal 203. When the current does not flow between the substrate terminal 205 and the pad terminal 204 or between the substrate terminal 205 and the ground terminal 203, the semiconductor device is determined to be a well-made product (normal), and the process proceeds to step S8 to execute the following step.

When the current flows at least either between the substrate terminal 205 and the pad terminal 204 or between the substrate terminal 205 and the ground terminal 203 in step S72, the semiconductor device is determined to be an inferior product (abnormal) since a short circuit is caused between the fusible resistor 3 and the semiconductor substrate 1 because of damage such as cracks caused in the field insulating film 2, and the process proceeds to step S6 to reject the product.

According to the first embodiment, the examination for determining the insulated state between the substrate terminal 205 and the pad terminal 204 as illustrated in FIG. 8 and the examination for determining the insulated state between the substrate terminal 205 and the ground terminal 203 as illustrated in FIG. 9 are executed after the trimming of the fusible resistor 3, so as to reject the product at the point of the examination during the manufacturing process when potential damage is caused at the circumference of the fusible resistor 3 due to the trimming, so as to improve the quality of the semiconductor device accordingly.

While the above embodiment is illustrated with the case of executing both the examination for determining the insulated state between the substrate terminal 205 and the pad terminal 204 as illustrated in FIG. 8 and the examination for determining the insulated state between the substrate terminal 205 and the ground terminal 203 as illustrated in FIG. 9, either the examination for determining the insulated state between the substrate terminal 205 and the pad terminal 204 as illustrated in FIG. 8 or the examination for determining the insulated state between the substrate terminal 205 and the ground terminal 203 as illustrated in FIG. 9 may only be executed.

Second Embodiment

<Semiconductor Device>

Figure 12:
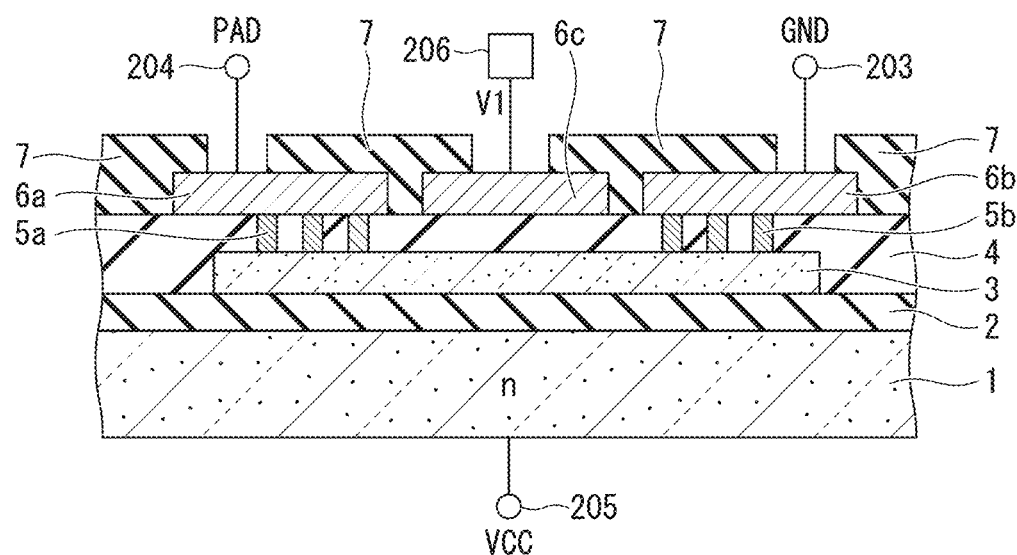
FIG. 12 is a cross-sectional view illustrating a semiconductor device according to a second embodiment before trimming.

A semiconductor device according to a second embodiment differs from the semiconductor device according to the first embodiment illustrated in FIG. 4 in further including an auxiliary wiring layer 6c provided on the interlayer insulating film 4 so as to overlap with the middle part of the fusible resistor 3, as illustrated in FIG. 12.

The auxiliary wiring layer 6c is connected to a pad for testing 206 provided over the semiconductor substrate 1. A voltage V1 for testing is applied to the pad for testing 206 during the examination after the trimming. The auxiliary wiring layer 6c may be made of the same material as the first wiring layer 6a and the second wiring layer 6b, or may be made of material different from each other. The other configurations of the semiconductor device according to the second embodiment are the same as those of the semiconductor device according to the first embodiment as illustrated in FIG. 4, and overlapping explanation are not repeated below.

In the semiconductor device according to the second embodiment, a voltage is applied between the substrate terminal 205 and the pad terminal 204 after the trimming of the fusible resistor 3, so as to examine the insulated state between the substrate terminal 205 and the pad terminal 204, as in the case of the examination in the semiconductor device according to the first embodiment as illustrated in FIG. 8. Further, a voltage is applied between the substrate terminal 205 and the ground terminal 203, so as to examine the insulated state between the substrate terminal 205 and the ground terminal 203, as in the case of the examination in the semiconductor device according to the first embodiment as illustrated in FIG. 9.

Figure 13:
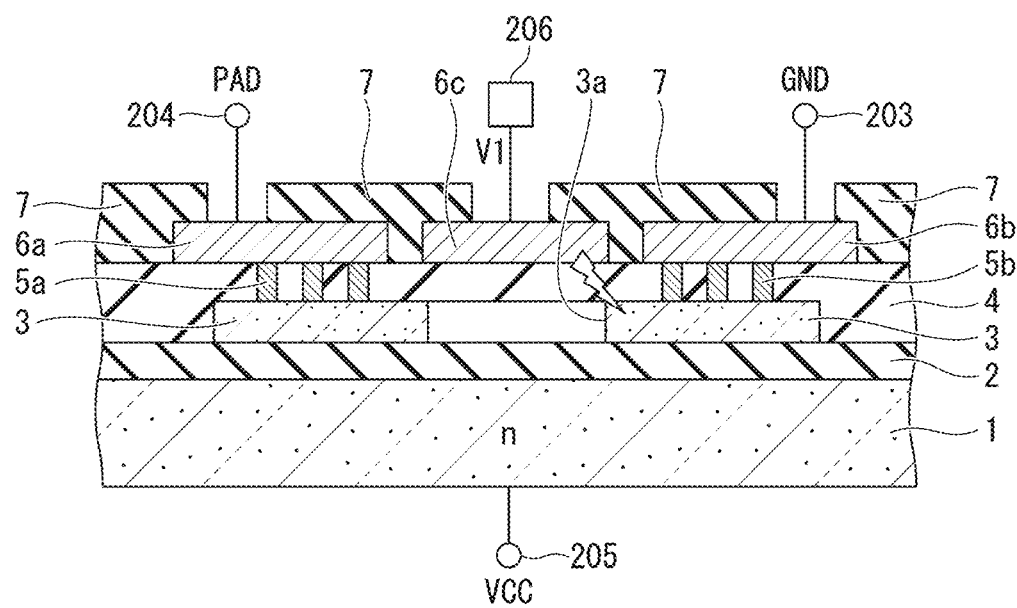
FIG. 13 is a cross-sectional view of the semiconductor device according to the second embodiment during determining a trimming abnormality.

In the semiconductor device according to the second embodiment, a voltage is also applied between the ground terminal 203 and the pad for testing 206 after the trimming of the fusible resistor 3 to examine an insulated state between the ground terminal 203 and the pad for testing 206, as illustrated in FIG. 13. When the current does not flow between the ground terminal 203 and the pad for testing 206, the semiconductor device according to the second embodiment is determined to be a well-made product (normal). When the current flows between the ground terminal 203 and the pad for testing 206, the semiconductor device according to the second embodiment is determined to be an inferior product (abnormal) since a short circuit is caused between the auxiliary wiring layer 6c and the fusible resistor 3 because of damage such as cracks caused in the interlayer insulating film 4 toward the ground terminal 203.

Figure 14:
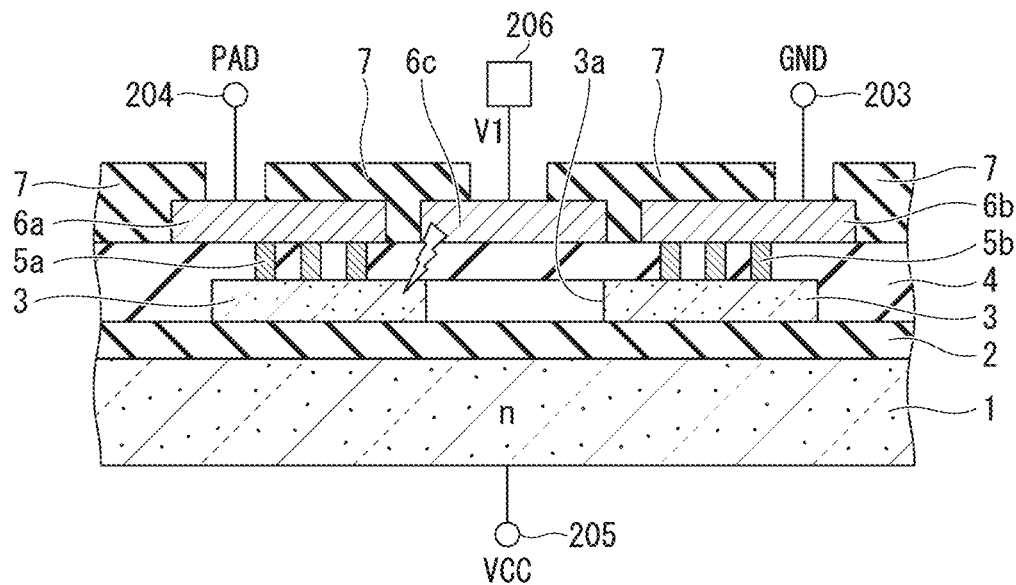
FIG. 14 is another cross-sectional view of the semiconductor device according to the second embodiment during determining the trimming abnormality.

Further, as illustrated in FIG. 14, a voltage is applied between the pad terminal 204 and the pad for testing 206 to examine an insulated state between the pad terminal 204 and the pad for testing 206. When the current does not flow between the pad terminal 204 and the pad for testing 206, the semiconductor device according to the second embodiment is determined to be a well-made product (normal). When the current flows between the pad terminal 204 and the pad for testing 206, the semiconductor device according to the second embodiment is determined to be an inferior product (abnormal) since a short circuit is caused between the auxiliary wiring layer 6c and the fusible resistor 3 because of damage such as cracks caused in the interlayer insulating film 4 toward the pad terminal 204.

A method for manufacturing the semiconductor device according to the second embodiment includes a process of forming the auxiliary wiring layer 6c simultaneously with the first and second wiring layers 6a and 6b illustrated in FIG. 12, and connecting the auxiliary wiring layer 6c to the pad for testing 206. In step S72 of determining the trimming abnormality illustrated in FIG. 11, the manufacturing method only needs to further execute an examination for determining an insulated state between the pad for testing 206 and the pad terminal 204 as illustrated in FIG. 13 and an examination for determining an insulated state between the pad for testing 206 and the ground terminal 203 as illustrated in FIG. 14, in addition to the examination for determining the insulated state between the substrate terminal 205 and the pad terminal 204 and the examination for determining the insulated state between the substrate terminal 205 and the ground terminal 203.

In step S72, either the examination for determining the insulated state between the pad for testing 206 and the pad terminal 204 as illustrated in FIG. 13 or the examination for determining the insulated state between the pad for testing 206 and the ground terminal 203 as illustrated in FIG. 14 may only be executed, instead of the execution of both the examination for determining the insulated state between the pad for testing 206 and the pad terminal 204 as illustrated in FIG. 13 and the examination for determining the insulated state between the pad for testing 206 and the ground terminal 203 as illustrated in FIG. 14. One of or both of the examination for determining the insulated state between the substrate terminal 205 and the pad terminal 204 and the examination for determining the insulated state between the substrate terminal 205 and the ground terminal 203 may be omitted.

According to the second embodiment, the examination for determining the insulated state between the pad for testing 206 and the pad terminal 204 as illustrated in FIG. 13 and the examination for determining the insulated state between the pad for testing 206 and the ground terminal 203 as illustrated in FIG. 14 are executed after the trimming of the fusible resistor 3, so as to reject the product at the point of the examination during the manufacturing process when potential damage is caused at the circumference of the fusible resistor 3 due to the trimming, improving the quality of the semiconductor device accordingly.

Third Embodiment

<Semiconductor Device>

Figure 15:
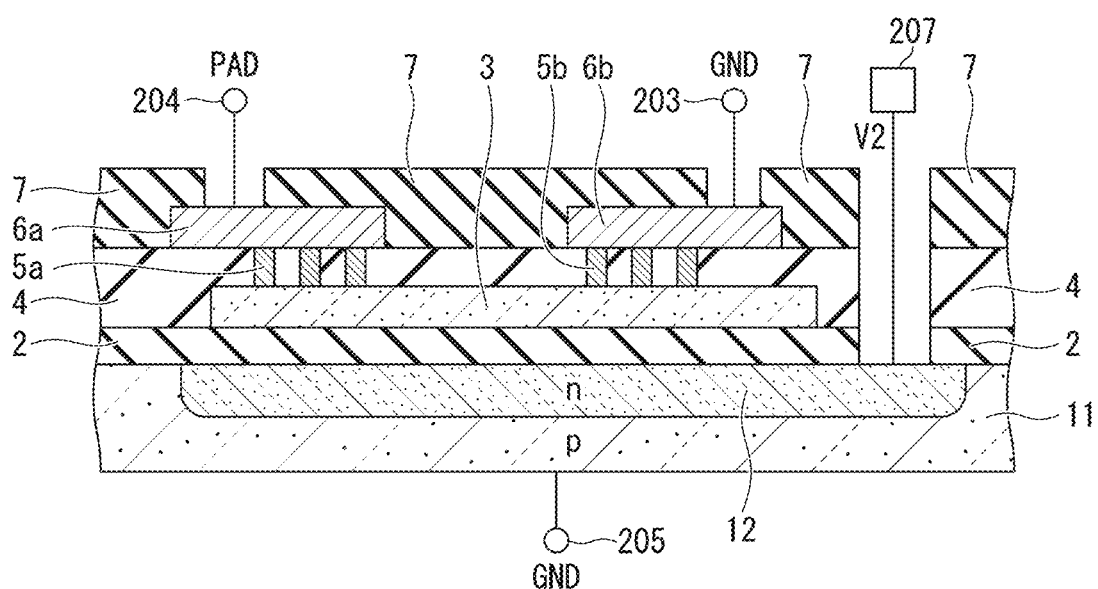
FIG. 15 is a cross-sectional view illustrating a semiconductor device according to a third embodiment before trimming.

A semiconductor device according to a third embodiment differs from the semiconductor device according to the first embodiment illustrated in FIG. 4 in using a semiconductor substrate 11 of a second conductivity type (p-type), as illustrated in FIG. 15. The substrate terminal 205 to which the third potential (the ground potential) GND is applied is connected to the semiconductor substrate 11. A semiconductor region 12 of the first conductivity type (n-type) is provided at an upper portion of the semiconductor substrate 11. The n-type semiconductor region 12 is arranged to include a region immediately below the fusible resistor 3.

A pad for testing 207 provided over the semiconductor substrate 11 is connected to the semiconductor region 12. A potential V2 for testing is applied to the pad for testing 207 during the examination after the trimming. The other configurations of the semiconductor device according to the third embodiment are the same as those of the semiconductor device according to the first embodiment as illustrated in FIG. 4, and overlapping explanation are not repeated below.

Figure 16:
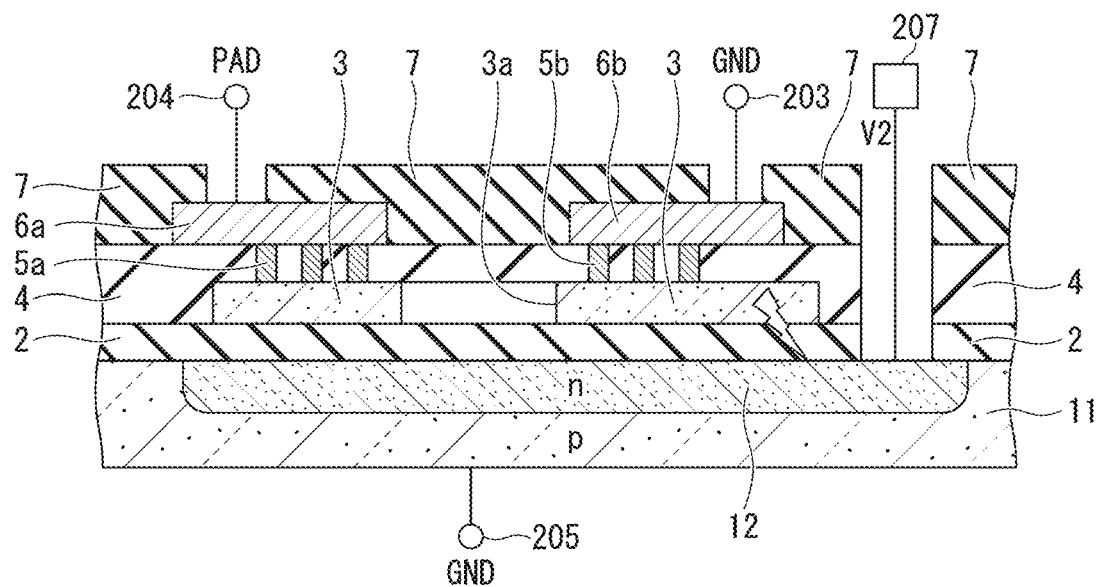
FIG. 16 is a cross-sectional view of the semiconductor device according to the third embodiment during determining a trimming abnormality.

In the semiconductor device according to the third embodiment, a voltage is applied between the pad for testing 207 and the ground terminal 203 after the trimming of the fusible resistor 3 to examine an insulated state between the pad for testing 207 and the ground terminal 203, as illustrated in FIG. 16. When the current does not flow between the pad for testing 207 and the ground terminal 203, the semiconductor device according to the third embodiment is determined to be a well-made product (normal). When the current flows between the pad for testing 207 and the ground terminal 203, the semiconductor device according to the third embodiment is determined to be an inferior product (abnormal) since a short circuit is caused between the fusible resistor 3 and the semiconductor region 12 because of damage such as cracks caused in the field insulating film 2 toward the ground terminal 203.

Figure 17:
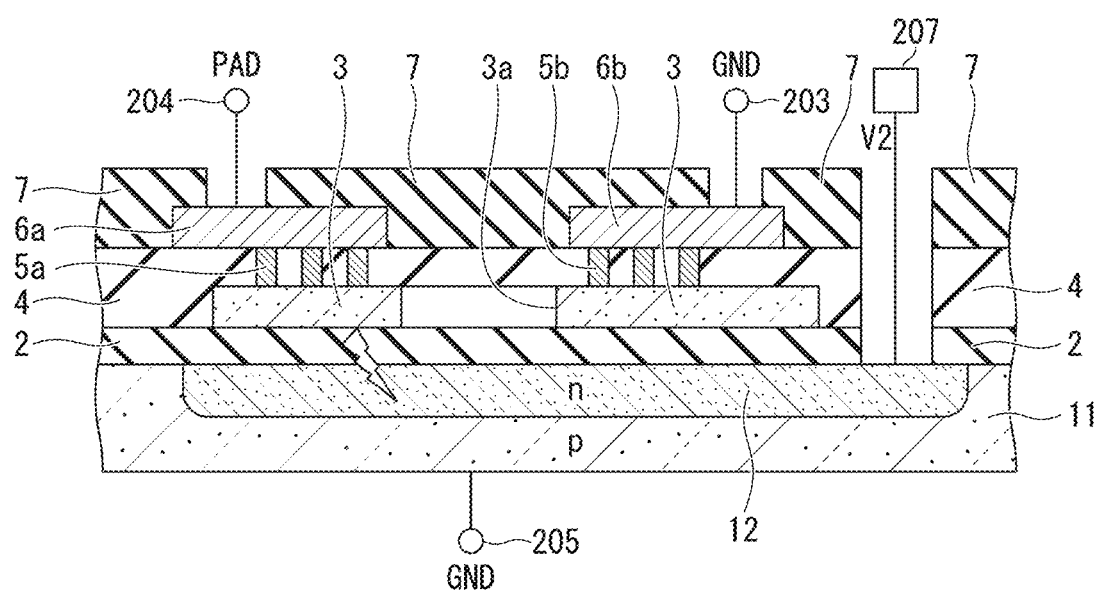
FIG. 17 is another cross-sectional view of the semiconductor device according to the third embodiment during determining the trimming abnormality.

Further, as illustrated in FIG. 17, a voltage is applied between the pad terminal 204 and the pad for testing 207 to examine an insulated state between the pad terminal 204 and the pad for testing 207. When the current does not flow between the pad terminal 204 and the pad for testing 207, the semiconductor device according to the third embodiment is determined to be a well-made product (normal). When the current flows between the pad terminal 204 and the pad for testing 207, the semiconductor device according to the third embodiment is determined to be an inferior product (abnormal) since a short circuit is caused between the fusible resistor 3 and the semiconductor region 12 because of damage such as cracks caused in the field insulating film 2 toward the pad terminal 204.

Figure 11:
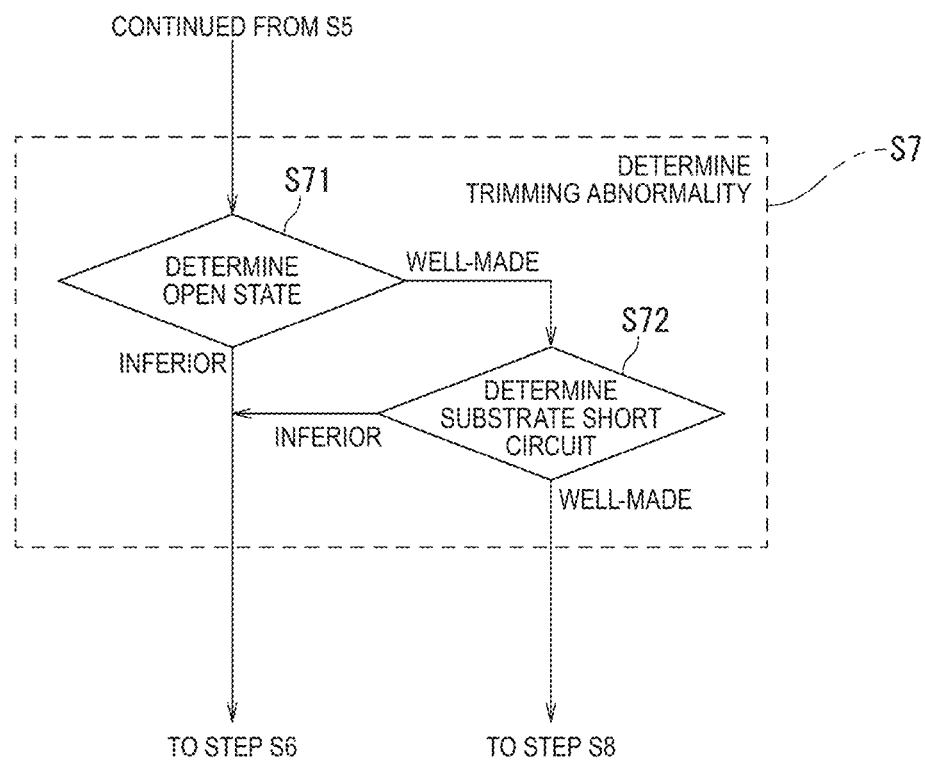
FIG. 11 is a flowchart of a process of determining the trimming abnormality in the manufacturing method for the semiconductor device according to the first embodiment.

The method for manufacturing the semiconductor device according to the third embodiment executes the examination for determining the insulated state between the pad for testing 207 and the ground terminal 203 as illustrated in FIG. 16 and executes the examination for determining the insulated state between the pad terminal 204 and the pad for testing 207 as illustrated in FIG. 17 in step S72 illustrated in FIG. 11.

According to the third embodiment, the examination for determining the insulated state between the pad for testing 207 and the ground terminal 203 as illustrated in FIG. 16 and the examination for determining the insulated state between the pad terminal 204 and the pad for testing 207 as illustrated in FIG. 17 are executed after the trimming of the fusible resistor 3, so as to reject the product at the point of the examination during the manufacturing process when potential damage is caused at the circumference of the fusible resistor 3 due to the trimming, improving the quality of the semiconductor device accordingly.

While the third embodiment is illustrated above with the case of executing both the examination for determining the insulated state between the pad for testing 207 and the ground terminal 203 as illustrated in FIG. 16 and the examination for determining the insulated state between the pad terminal 204 and the pad for testing 207 as illustrated in FIG. 17, either the examination for determining the insulated state between the pad for testing 207 and the ground terminal 203 as illustrated in FIG. 16 or the examination for determining the insulated state between the pad terminal 204 and the pad for testing 207 as illustrated in FIG. 17 may only be executed.

Fourth Embodiment

<Semiconductor Device>

Figure 18:
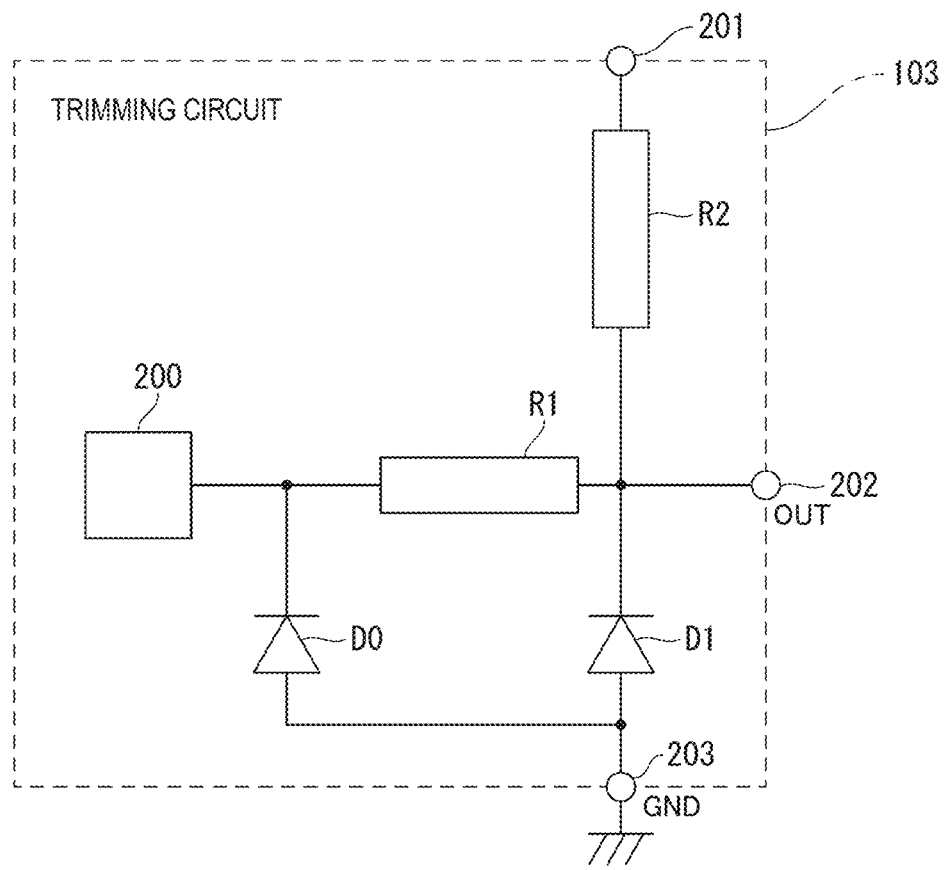
FIG. 18 is a circuit diagram illustrating a trimming circuit of the semiconductor device according to a fourth embodiment.

A semiconductor device according to a fourth embodiment differs from the semiconductor device according to the first embodiment illustrated in FIG. 2 in that the trimming circuit 103 is a Zener zap trimming circuit, as illustrated in FIG. 18.

The trimming circuit 103 includes a trimming element implemented by a Zener zap diode D0. A cathode of the Zener zap diode D0 is connected to the pad for trimming 200 and one end of the protection resistor R1. The other end of the protection resistor R1 is connected to one end of the protection resistor 2, the output terminal 202, and the cathode of the protection diode D1.

The other end of the protection resistor R2 is connected to the power supply terminal 201 to which the first potential (the power supply potential) VDD is applied. The resistance value of the protection resistor R2 is higher than the resistance value of the protection resistor R1. Instead of the protection resistor R2, a depletion-mode (normally-ON) MOS transistor may be used.

An anode of the Zener zap diode D0 is connected to the anode of the protection diode D1 and the ground terminal 203. The second potential (the ground potential) GND is applied to the ground terminal 203. The protection diode D1 is a Zener diode. A breakdown voltage Vz of the protection diode D1 is about 5 volts, for example.

Before the trimming, the Zener zap diode D0 is in the open state between the cathode and the anode. The L level voltage (such as zero volts) is output as an output value OUT from the output terminal 202 of the trimming circuit 103.

During the trimming, a voltage for trimming is applied from the pad for trimming 200 to cause short-circuit destruction with avalanche current at the p-n junction of the Zener zap diode D0, so as to shift the Zener zap diode D0 from the open state to the short-circuit state between the cathode and the anode. The output value OUT is logically inversed so as to be output from the output terminal 202 of the trimming circuit 103 as the H level voltage (such as five volts).

Figure 19:
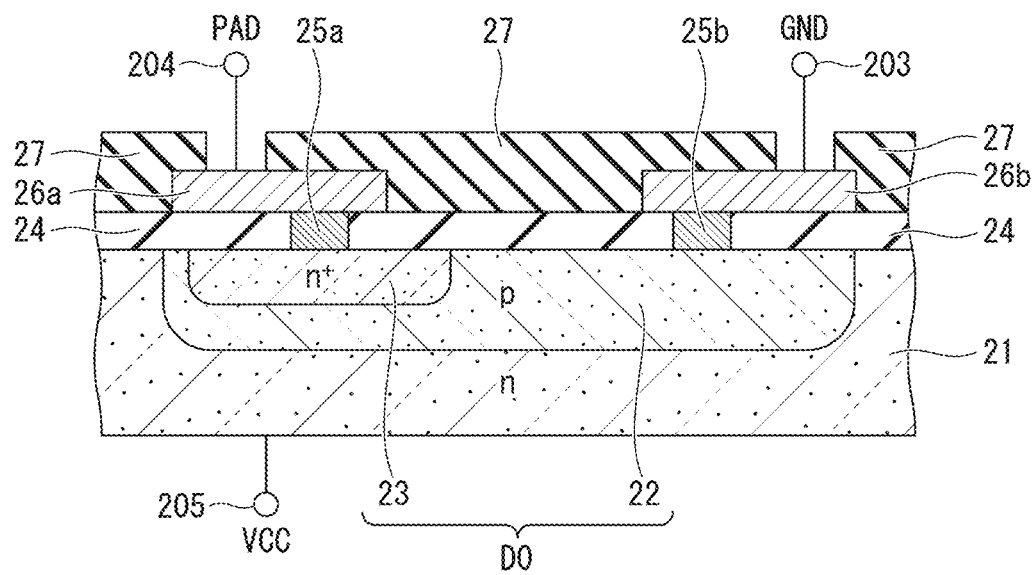
FIG. 19 is a cross-sectional view illustrating a semiconductor device according to the fourth embodiment before trimming.

FIG. 19 is a cross-sectional view of a circumference of the Zener zap diode D0 illustrated in FIG. 18. As illustrated in FIG. 19, the semiconductor device according to the fourth embodiment includes a semiconductor substrate 21 of the first conductivity type (n-type), a first semiconductor region 22 of the second conductivity type (p-type) provided at an upper portion of the semiconductor substrate 21, and a second semiconductor region 23 of the first conductivity type ($n^+$-type) provided at an upper portion of the first semiconductor region 22. The p-type first semiconductor region 22 and the $n^+$-type second semiconductor region 23 implement the Zener zap diode D0.

The substrate terminal 205 to which the third potential (the reference potential) Vcc (about 13 volts, for example) is applied is connected to the semiconductor substrate 21. An insulating film (a field insulating film) 24 is deposited on the semiconductor substrate 21. A first wiring layer 26a is provided on the field insulating film 24 so as to overlap with the second semiconductor region 23. The first wiring layer 26a is electrically connected to the second semiconductor region 23 via a first contact region 25a penetrating the field insulating film 24. The first wiring layer 26a is connected to the pad terminal 204. The pad terminal 204 is connected to the pad for trimming 200 illustrated in FIG. 18, and a potential PAD is applied to the pad terminal 204.

A second wiring layer 26b is provided on the field insulating film 24 so as to overlap with the first semiconductor region 22. The second wiring layer 26b is electrically connected to the first semiconductor region 22 via a second contact region 25b penetrating the field insulating film 24. The second wiring layer 26b is connected to the ground terminal 203 to which the ground potential GND is applied. An insulating film (an interlayer insulating film) 27 is deposited on the first wiring layer 26a and the second wiring layer 26b. The other configurations of the semiconductor device according to the fourth embodiment are the same as those of the semiconductor device according to the first embodiment illustrated in FIG. 4, and overlapping explanations are not repeated below.

Figure 20:
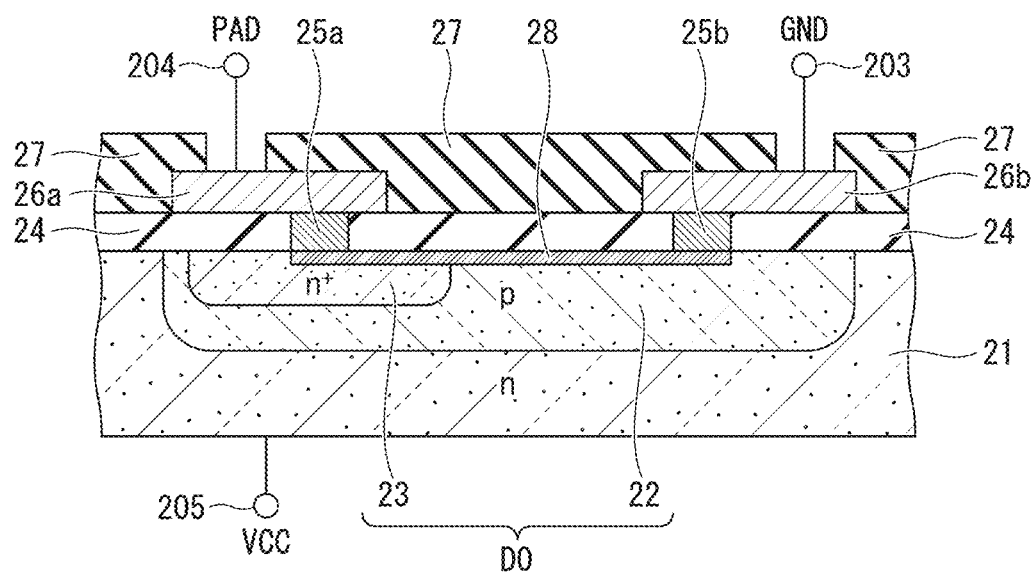
FIG. 20 is a cross-sectional view illustrating a semiconductor device according to the fourth embodiment after the trimming.

As illustrated in FIG. 20, upon the trimming of the Zener zap diode D0, a voltage for trimming PAD is applied to the ground terminal 203 from the pad terminal 204 to cause short-circuit destruction with avalanche current at the p-n junction of the Zener zap diode D0 to cause metal 28 included in the wiring layers such as the first contact region 25a and the second contact region 25b to be melted to enter the upper surface of the semiconductor substrate 21, so as to lead the Zener zap diode D0 to be shifted from the open state to the short-circuit state between the anode and the cathode. After the trimming of the Zener zap diode D0, the voltage for testing lower than the voltage for trimming is applied as a voltage PAD to the ground terminal 203 from the pad terminal 204 so as to confirm that the Zener zap diode D0 is in the short-circuit state between the cathode and the anode.

However, potential damage could be caused at the circumference of the Zener zap diode D0 even after the short-circuit state is confirmed between the anode and the cathode of the Zener zap diode D0. The fourth embodiment detects such potential damage caused at the circumference of the Zener zap diode D0.

Figure 21:
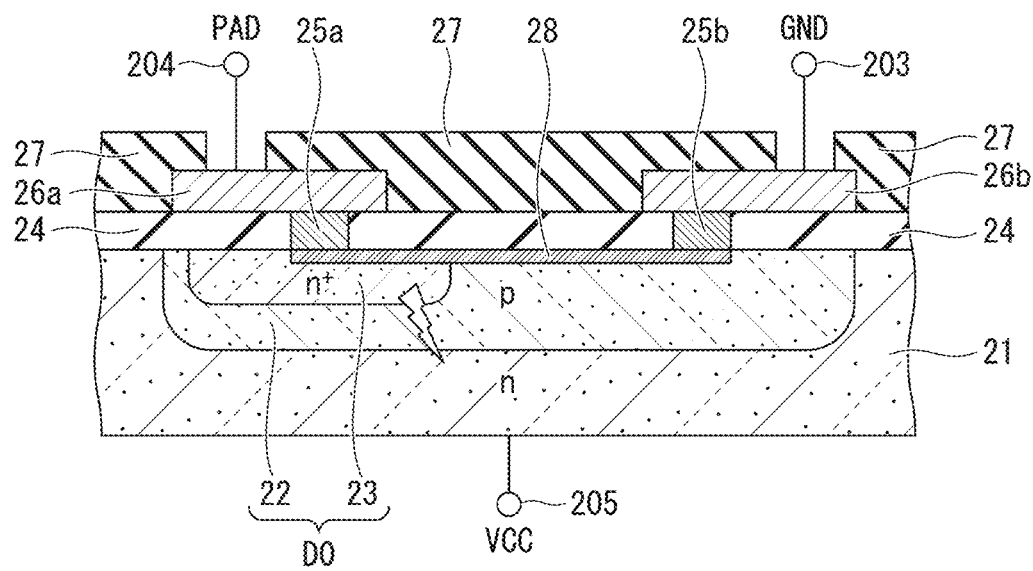
FIG. 21 is a cross-sectional view of the semiconductor device according to the fourth embodiment during determining a trimming abnormality.

After the trimming of the Zener zap diode D0, a voltage is applied between the substrate terminal 205 and the pad terminal 204 to examine an insulated state between the substrate terminal 205 and the pad terminal 204, as illustrated in FIG. 21. When the current does not flow between the substrate terminal 205 and the pad terminal 204, the semiconductor device according to the fourth embodiment is determined to be a well-made product (normal). When the current flows between the substrate terminal 205 and the pad terminal 204, the semiconductor device according to the fourth embodiment is determined to be an inferior product (abnormal) since a short circuit is caused between the substrate terminal 205 and the pad terminal 204 because of damage to the Zener zap diode D0.

Figure 22:
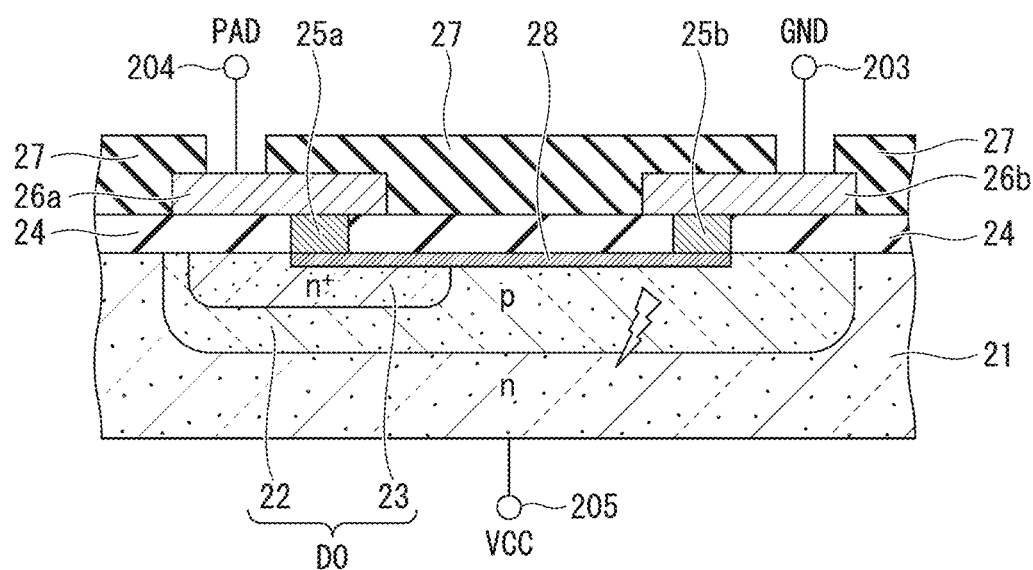
FIG. 22 is another cross-sectional view of the semiconductor device according to the fourth embodiment during determining the trimming abnormality.

Further, after the trimming of the Zener zap diode D0, a voltage is applied between the substrate terminal 205 and the ground terminal 203 to examine an insulated state between the substrate terminal 205 and the ground terminal 203, as illustrated in FIG. 22. When the current does not flow between the substrate terminal 205 and the ground terminal 203, the semiconductor device according to the fourth embodiment is determined to be a well-made product (normal). When the current flows between the substrate terminal 205 and the ground terminal 203, the semiconductor device according to the fourth embodiment is determined to be an inferior product (abnormal) since a short circuit is caused between the substrate terminal 205 and the ground terminal 203 because of damage to the Zener zap diode D0.

A method for manufacturing the semiconductor device according to the fourth embodiment first prepares the n-type semiconductor substrate 21 illustrated in FIG. 19. Next, the p-type first semiconductor region 22 and the $n^+$-type second semiconductor region 23 are formed at the upper part of the semiconductor substrate 21 by ion implantation and annealing, for example, so as to form the Zener zap diode D0.

Next, the field insulating film 24 is formed on the semiconductor substrate 21 in the same manner as in the first embodiment. The first contact region 25a and the second contact region 25b are then buried in the penetration holes of the field insulating film 24, and the first wiring layer 26a and the second wiring layer 26b are formed on the filed insulating film 24. The interlayer insulating film 27 is further formed on the first wiring layer 26a and the second wiring layer 26b.

Figure 10:
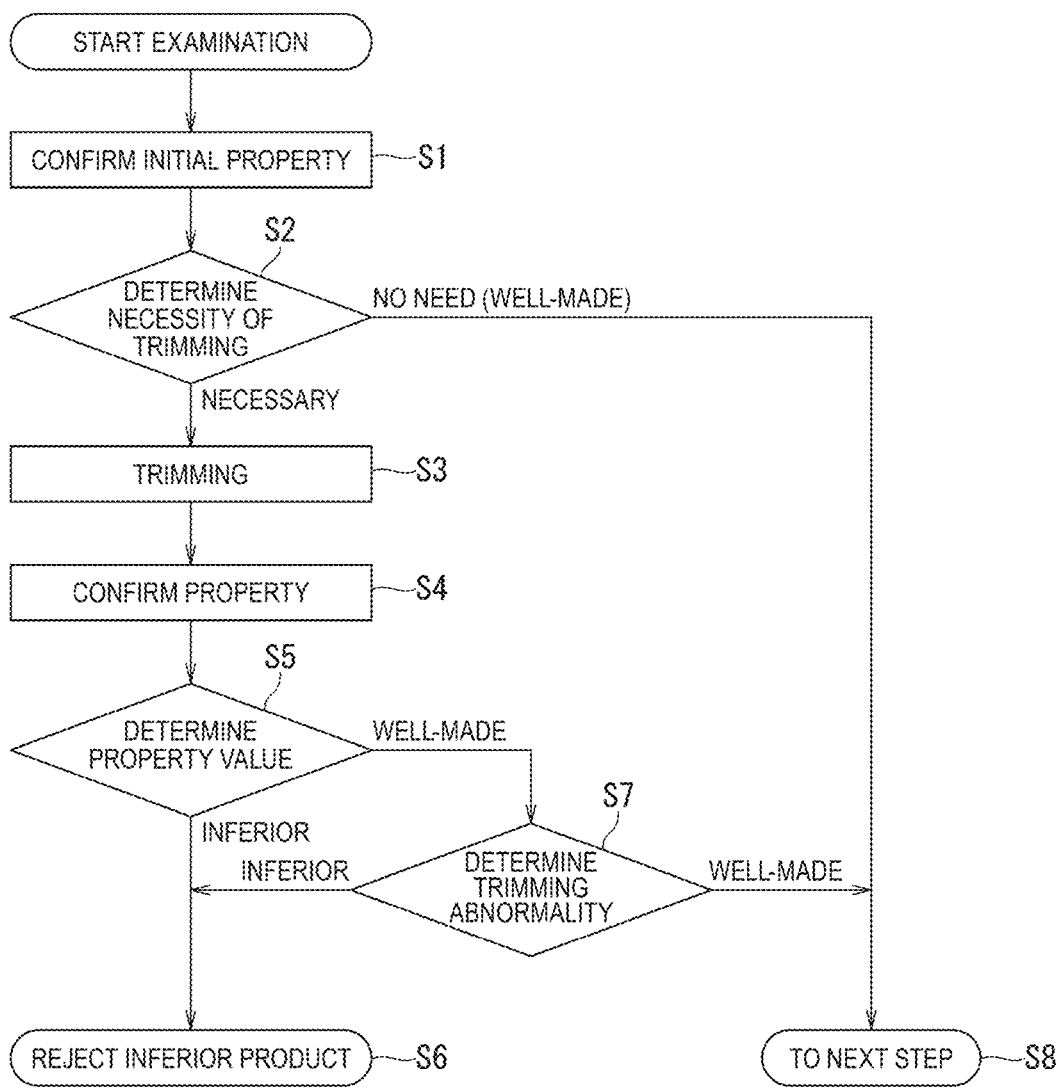
FIG. 10 is a flowchart of a trimming process in a manufacturing method for the semiconductor device according to the first embodiment.

In step S72 of determining the trimming abnormality as illustrated in FIG. 11, the examination for determining the insulated state between the substrate terminal 205 and the pad terminal 204 as illustrated in FIG. 21 and the examination for determining the insulated state between the substrate terminal 205 and the ground terminal 203 as illustrated in FIG. 22 are executed. The other steps of the method for manufacturing the semiconductor device according to the fourth embodiment are the same as those in the method for manufacturing the semiconductor device according to the first embodiment as illustrated in FIG. 10 and FIG. 11.

According to the fourth embodiment, the examination for determining the insulated state between the substrate terminal 205 and the pad terminal 204 as illustrated in FIG. 21 and the examination for determining the insulated state between the substrate terminal 205 and the ground terminal 203 as illustrated in FIG. 22 are executed after the trimming of the Zener zap diode D0, so as to reject the product at the point of the examination during the manufacturing process when potential damage is caused at the circumference of the Zener zap diode D0 due to the trimming, improving the quality of the semiconductor device accordingly.

While the fourth embodiment is illustrated above with the case of executing both the examination for determining the insulated state between the substrate terminal 205 and the pad terminal 204 as illustrated in FIG. 21 and the examination for determining the insulated state between the substrate terminal 205 and the ground terminal 203 as illustrated in FIG. 22, either the examination for determining the insulated state between the substrate terminal 205 and the pad terminal 204 as illustrated in FIG. 21 or the examination for determining the insulated state between the substrate terminal 205 and the ground terminal 203 as illustrated in FIG. 22 may only be executed.

Fifth Embodiment

<Semiconductor Device>

Figure 23:
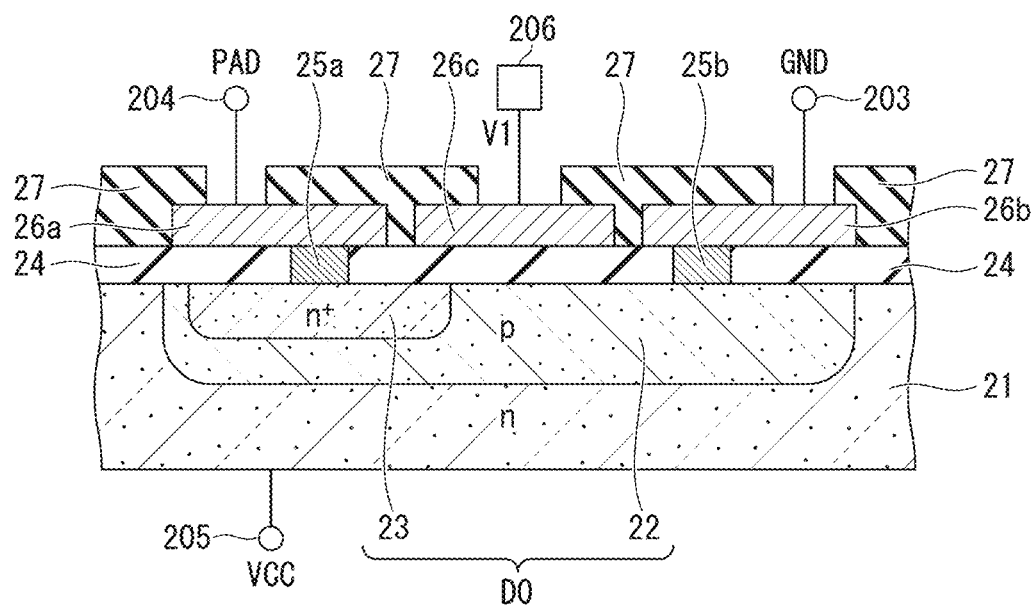
FIG. 23 is a cross-sectional view illustrating a semiconductor device according to a fifth embodiment before trimming.

A semiconductor device according to a fifth embodiment differs from the semiconductor device according to the fourth embodiment illustrated in FIG. 19 in further including an auxiliary wiring layer 26c provided on the field insulating film 24, as illustrated in FIG. 23.

The auxiliary wiring layer 26c is arranged to overlap with a region adjacent to the p-n junction between the first semiconductor region 22 and the second semiconductor region 23. The auxiliary wiring layer 26c is connected to the pad for testing 206. The potential V1 for testing is applied to the pad for testing 206 during the examination after the trimming. The auxiliary wiring layer 26c may be made of the same material as the first wiring layer 26a and the second wiring layer 26b, or may be made of material different from each other. The other configurations of the semiconductor device according to the fifth embodiment are the same as those of the semiconductor device according to the fourth embodiment as illustrated in FIG. 19, and overlapping explanation are not repeated below.

In the semiconductor device according to the fifth embodiment, a voltage is applied between the substrate terminal 205 and the pad terminal 204 after the trimming of the Zener zap diode D0, so as to examine the insulated state between the substrate terminal 205 and the pad terminal 204, as in the case of the examination in the semiconductor device according to the fourth embodiment as illustrated in FIG. 21. Further, a voltage is applied between the substrate terminal 205 and the ground terminal 203, so as to examine the insulated state between the substrate terminal 205 and the ground terminal 203, as in the case of the examination in the semiconductor device according to the fourth embodiment as illustrated in FIG. 22.

Figure 24:
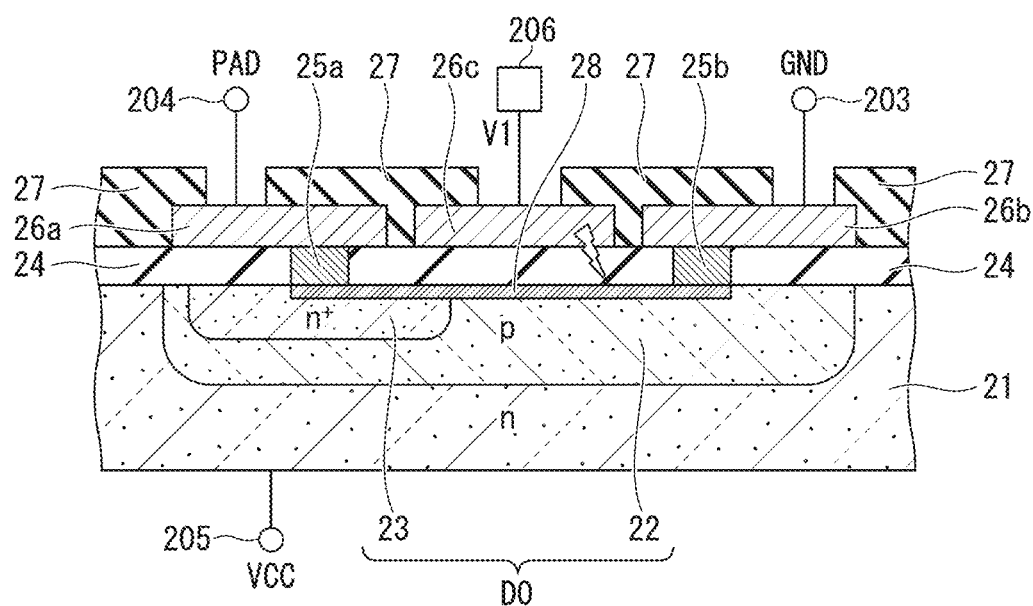
FIG. 24 is a cross-sectional view of the semiconductor device according to the fifth embodiment during determining a trimming abnormality.

In the semiconductor device according to the fifth embodiment, a voltage is also applied between the ground terminal 203 and the pad for testing 206 after the trimming of the Zener zap diode D0 to examine the insulated state between the ground terminal 203 and the pad for testing 206, as illustrated in FIG. 24. When the current does not flow between the ground terminal 203 and the pad for testing 206, the semiconductor device according to the fifth embodiment is determined to be a well-made product (normal). When the current flows between the ground terminal 203 and the pad for testing 206, the semiconductor device according to the fifth embodiment is determined to be an inferior product (abnormal) since a short circuit is caused between the auxiliary wiring layer 26c and the Zener zap diode D0 because of damage to the field insulating film 24.

Figure 25:
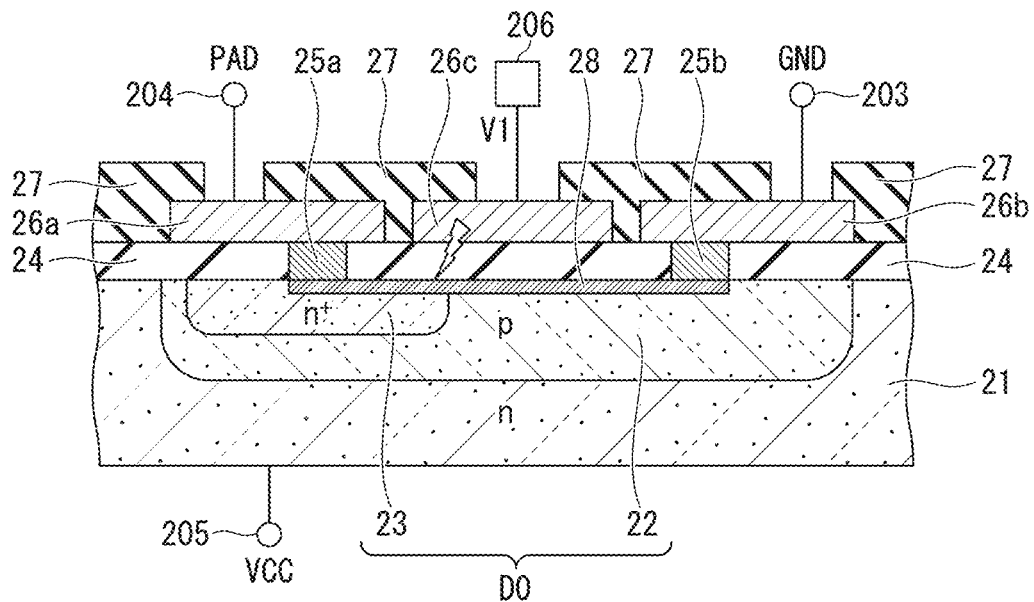
FIG. 25 is another cross-sectional view of the semiconductor device according to the fifth embodiment during determining the trimming abnormality.

Further, as illustrated in FIG. 25, a voltage is applied between the pad terminal 204 and the pad for testing 206 to examine the insulated state between the pad terminal 204 and the pad for testing 206. When the current does not flow between the pad terminal 204 and the pad for testing 206, the semiconductor device according to the fifth embodiment is determined to be a well-made product (normal). When the current flows between the pad terminal 204 and the pad for testing 206, the semiconductor device according to the fifth embodiment is determined to be an inferior product (abnormal) since a short circuit is caused between the auxiliary wiring layer 6c and the Zener zap diode D0 because of damage to the field insulating film 24.

A method for manufacturing the semiconductor device according to the fifth embodiment only needs to further execute the examination for determining the insulated state between the pad for testing 206 and the pad terminal 204 as illustrated in FIG. 24 and the examination for determining the insulated state between the pad for testing 206 and the ground terminal 203 as illustrated in FIG. 25 in step S72 illustrated in FIG. 11. The other steps of the method for manufacturing the semiconductor device according to the fifth embodiment are the same as those of the method for manufacturing the semiconductor device according to the fourth embodiment.

According to the fifth embodiment, the examination for determining the insulated state between the pad for testing 206 and the pad terminal 204 as illustrated in FIG. 24 and the examination for determining the insulated state between the pad for testing 206 and the ground terminal 203 as illustrated in FIG. 25 are executed after the trimming of the Zener zap diode D0, so as to reject the product at the point of the examination during the manufacturing process when potential damage is caused at the circumference of the Zener zap diode D0 due to the trimming, improving the quality of the semiconductor device accordingly.

While the fifth embodiment is illustrated above with the case of executing both the examination for determining the insulated state between the pad for testing 206 and the pad terminal 204 as illustrated in FIG. 24 and the examination for determining the insulated state between the pad for testing 206 and the ground terminal 203 as illustrated in FIG. 25, either the examination for determining the insulated state between the pad for testing 206 and the pad terminal 204 as illustrated in FIG. 24 or the examination for determining the insulated state between the pad for testing 206 and the ground terminal 203 as illustrated in FIG. 25 may only be executed. One of or both of the examination for determining the insulated state between the substrate terminal 205 and the pad terminal 204 and the examination for determining the insulated state between the substrate terminal 205 and the ground terminal 203 may be omitted.

Sixth Embodiment

<Semiconductor Device>

Figure 26:
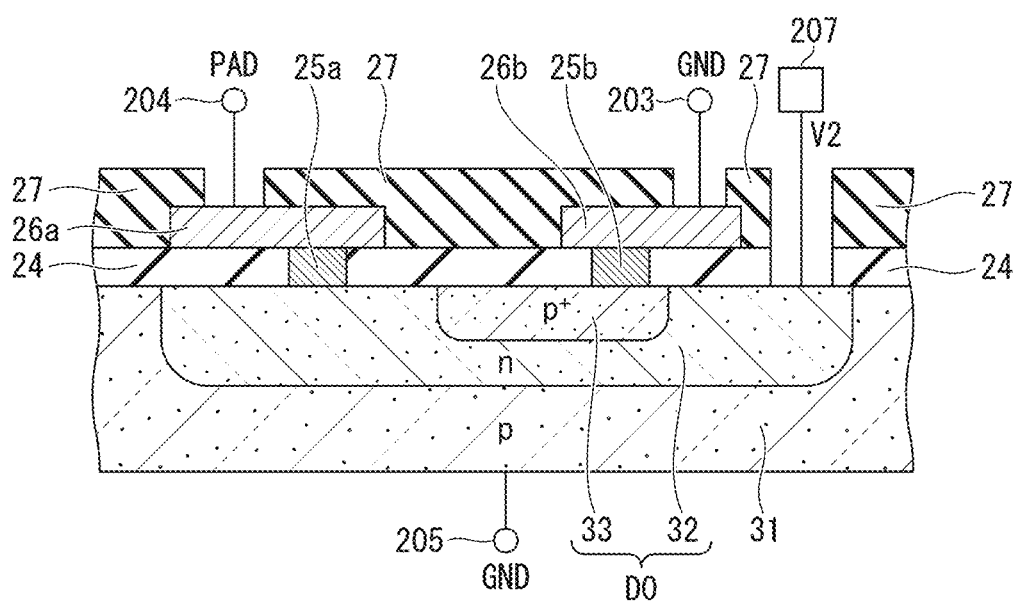
FIG. 26 is a cross-sectional view illustrating a semiconductor device according to a sixth embodiment before trimming.

A semiconductor device according to a sixth embodiment differs from the semiconductor device according to the fourth embodiment illustrated in FIG. 19 in using a semiconductor substrate 31 of the second conductivity type (p-type), as illustrated in FIG. 26. The semiconductor device according to the sixth embodiment includes a first semiconductor region 32 of the first conductivity type (n-type) provided at an upper portion of the semiconductor substrate 31 and a second semiconductor region 33 of the second conductivity type ($p^+$-type) provided at an upper portion of the first semiconductor region 32. The n-type first semiconductor region 32 and the $p^+$-type second semiconductor region 33 implement the Zener zap diode D0.

The first wiring layer 26a is electrically connected to the first semiconductor region 32 via the first contact region 25a. The second wiring layer 26b is electrically connected to the second semiconductor region 33 via the second contact region 25b. The first semiconductor region 32 is connected to the pad for testing 207 provided over the semiconductor substrate 31. A potential V1 for testing is applied to the pad for testing 207 during the examination after the trimming. The other configurations of the semiconductor device according to the sixth embodiment are the same as those of the semiconductor device according to the fourth embodiment as illustrated in FIG. 19, and overlapping explanation are not repeated below.

Figure 27:
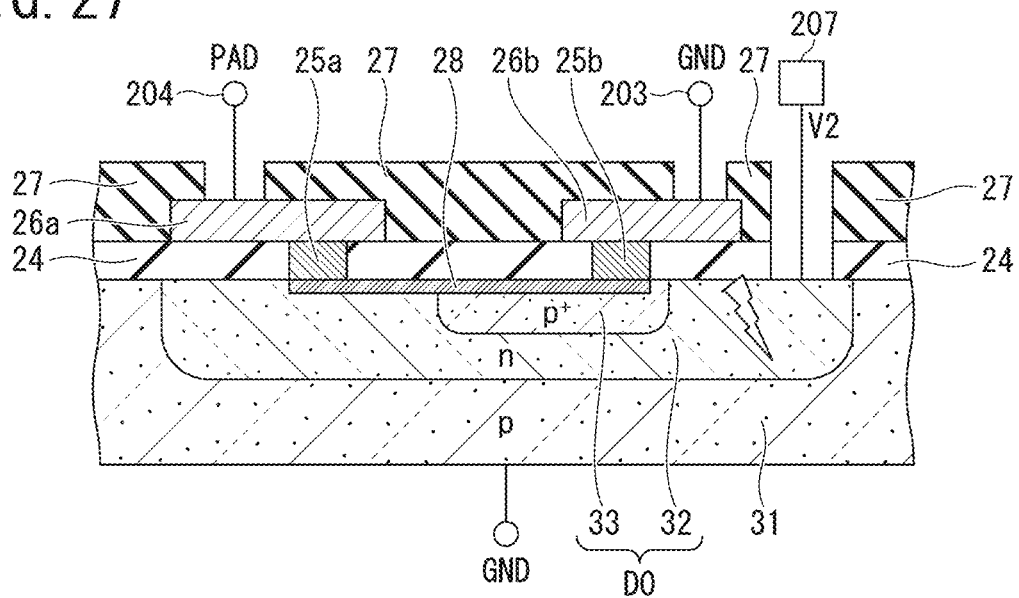
FIG. 27 is a cross-sectional view of the semiconductor device according to the sixth embodiment during determining a trimming abnormality.

In the semiconductor device according to the sixth embodiment, a voltage is applied between the pad for testing 207 and the ground terminal 203 after the trimming of the Zener zap diode D0 to examine the insulated state between the pad for testing 207 and the ground terminal 203, as illustrated in FIG. 27. When the current does not flow between the pad for testing 207 and the ground terminal 203, the semiconductor device according to the sixth embodiment is determined to be a well-made product (normal). When the current flows between the pad for testing 207 and the ground terminal 203, the semiconductor device according to the sixth embodiment is determined to be an inferior product (abnormal) since a short circuit is caused between the Zener zap diode D0 and the first semiconductor region 32 because of damage caused at the circumference of the Zener zap diode D0.

Figure 28:
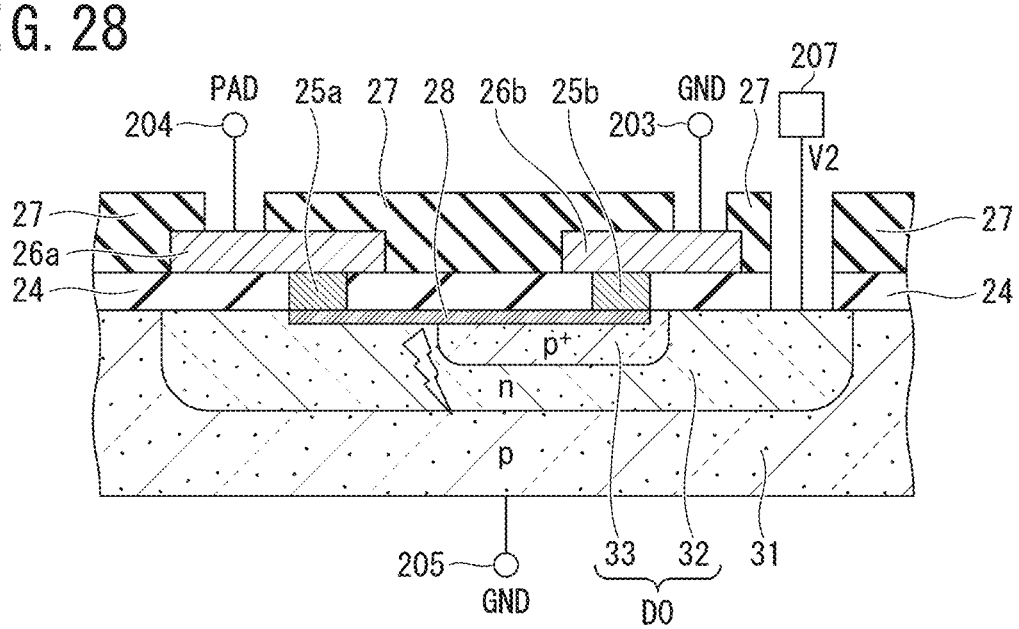
FIG. 28 is another cross-sectional view of the semiconductor device according to the sixth embodiment during determining the trimming abnormality.

Further, a voltage is applied between the pad terminal 204 and the pad for testing 207 to examine the insulated state between the pad terminal 204 and the pad for testing 207, as illustrated in FIG. 28. When the current does not flow between the pad terminal 204 and the pad for testing 207, the semiconductor device according to the sixth embodiment is determined to be a well-made product (normal). When the current flows between the pad terminal 204 and the pad for testing 207, the semiconductor device according to the sixth embodiment is determined to be an inferior product (abnormal) since a short circuit is caused between the Zener zap diode D0 and the first semiconductor region 32 because of damage caused at the circumference of the Zener zap diode D0.

A method for manufacturing the semiconductor device according to the sixth embodiment only needs to further execute the examination for determining the insulated state between the pad for testing 207 and the ground terminal 203 as illustrated in FIG. 27 and the examination for determining the insulated state between the pad terminal 204 and the pad for testing 207 as illustrated in FIG. 28 in step S72 illustrated in FIG. 11. The other steps of the method for manufacturing the semiconductor device according to the sixth embodiment are the same as those of the method for manufacturing the semiconductor device according to the fourth embodiment.

According to the sixth embodiment, the examination for determining the insulated state between the pad for testing 207 and the ground terminal 203 as illustrated in FIG. 27 and the examination for determining the insulated state between the pad terminal 204 and the pad for testing 207 as illustrated in FIG. 28 are executed after the trimming of the Zener zap diode D0, so as to reject the product at the point of the examination during the manufacturing process when potential damage is caused at the circumference of the Zener zap diode D0 due to the trimming, improving the quality of the semiconductor device accordingly.

While the sixth embodiment is illustrated above with the case of executing both the examination for determining the insulated state between the pad for testing 207 and the ground terminal 203 as illustrated in FIG. 27 and the examination for determining the insulated state between the pad terminal 204 and the pad for testing 207 as illustrated in FIG. 28, either the examination for determining the insulated state between the pad for testing 207 and the ground terminal 203 as illustrated in FIG. 27 or the examination for determining the insulated state between the pad terminal 204 and the pad for testing 207 as illustrated in FIG. 28 may only be executed.

Other Embodiments

While the present invention has been described above by reference to the first to sixth embodiments, it should be understood that the present invention is not intended to be limited to the descriptions and the drawings composing part of this disclosure. Various alternative embodiments, examples, and technical applications will be apparent to those skilled in the art according to this disclosure.

The first to sixth embodiments may be combined as appropriate. For example, the semiconductor device according to the third embodiment as illustrated in FIG. 15 may have a configuration in which an auxiliary wiring layer is provided on the interlayer insulating film 4 so as to be connected to a pad for testing, as in the case of the semiconductor device according to the second embodiment as illustrated in FIG. 12. This case can execute the examination for determining the insulated state between the pad for testing and the pad terminal 204 and the examination for determining the insulated state between the pad for testing and the ground terminal 203.

In addition, the semiconductor device according to the sixth embodiment as illustrated in FIG. 26 may have a configuration in which an auxiliary wiring layer is provided on the field insulating film 24 so as to be connected to a pad for testing, as in the case of the semiconductor device according to the fifth embodiment as illustrated in FIG. 23. This case can execute the examination for determining the insulated state between the pad for testing and the pad terminal 204 and the examination for determining the insulated state between the pad for testing and the ground terminal 203.

While the first to third embodiments have been illustrated above with the case of applying the voltage between the terminals of the fusible resistor 3 so as to be blown out by Joule heat, as the method of trimming the fusible resistor 3 implementing the trimming element, laser trimming for cutting out the fusible resistor by laser irradiation may be used instead.

It will be apparent to those skilled in the art that the present invention should include various alternative embodiments, examples, and technical applications in view of the intentions of the technical contents as disclosed in the respective embodiments. It should be understood that the present invention includes various embodiments not disclosed herein, such as a configuration to which the respective configurations as described in the above embodiments and the respective modified examples are optionally applied. Therefore, the technical scope of the present invention is defined only by the subject matter according to the claims reasonably derived from the foregoing illustrative descriptions.

What is claimed is:

1. A semiconductor device comprising:
   a trimming element buried in or provided over a semiconductor substrate;

an insulating film provided on the trimming element;
a first wiring layer provided on the insulating film and connected to one end of the trimming element via a first contact region penetrating the insulating film;
a second wiring layer provided on the insulating film and connected to another end of the trimming element via a second contact region penetrating the insulating film; and
an auxiliary wiring layer provided at a position separated from the first wiring layer and the second wiring layer, the auxiliary wiring layer for examination of an insulated state of the insulating film between the auxiliary wiring layer and the trimming element to determine whether current flows between the second wiring layer and the auxiliary wiring layer when voltage is applied between the second wiring layer and the auxiliary wiring layer,
wherein
the insulated state between the auxiliary wiring layer and either the first wiring layer or the second wiring layer is examined after trimming of the trimming element,
the trimming element is a fusible resistor provided over the semiconductor substrate via an insulating film, and
the middle part has a narrower width than the one end and the other end in a second direction orthogonal to the first direction.

2. The semiconductor device of claim 1, wherein the auxiliary wiring layer is insulated from the first wiring layer and the second wiring layer.

3. The semiconductor device of claim 1, further comprising:
an internal circuit on the semiconductor substrate, the internal circuit comprising a vertical transistor including an insulated gate bipolar transistor (IGBT); and
a trimming circuit connected to the internal circuit on the semiconductor substrate,
wherein the trimming circuit comprises the trimming element, the insulating film, the first wiring layer, the second wiring layer and the auxiliary wiring layer.

4. The semiconductor device of claim 1, wherein the auxiliary wiring layer is made of metal.

5. A semiconductor device comprising:
a trimming element buried in or provided over a semiconductor substrate;
an insulating film provided on the trimming element;
a first wiring layer provided on the insulating film and connected to one end of the trimming element via a first contact region penetrating the insulating film;
a second wiring layer provided on the insulating film and connected to another end of the trimming element via a second contact region penetrating the insulating film; and
an auxiliary wiring layer provided on the insulating film, at a position overlapping with a middle part provided between the one end and the other end of the trimming element in a first direction and separated from the first wiring layer and the second wiring layer, and connected to only one electrode pad, the auxiliary wiring layer for examination of an insulated state of the insulating film between the auxiliary wiring layer and the trimming element to determine whether current flows between the second wiring layer and the auxiliary wiring layer when voltage is applied between the second wiring layer and the auxiliary wiring layer,
wherein
the insulated state between the auxiliary wiring layer and either the first wiring layer or the second wiring layer is examined after trimming of the trimming element,
the trimming element is a fusible resistor provided over the semiconductor substrate via an insulating film, and the middle part has a narrower width than the one end and the other end in a second direction orthogonal to the first direction.

6. A semiconductor device comprising:
a trimming element buried in or provided over a semiconductor substrate;
an insulating film provided on the trimming element;
a first wiring layer provided on the insulating film and connected to one end of the trimming element via a first contact region penetrating the insulating film;
a second wiring layer provided on the insulating film and connected to another end of the trimming element via a second contact region penetrating the insulating film; and
an auxiliary wiring layer provided on the insulating film at a position overlapping with a middle part of the trimming element,
wherein the middle part is provided between the one end and the other end in a first direction,
the first wiring layer, second wiring layer and the auxiliary wiring layer are in contact with a top surface of the insulating film,
a thickness of the insulating film between the trimming element and each of the first wiring layer and the second wiring later is equal to a thickness of the insulating film between the auxiliary wiring layer and the trimming element, and
the auxiliary wiring layer for examination of an insulated state of the insulating film between the auxiliary wiring layer and the trimming element to determine whether current flows between the second wiring layer and the auxiliary wiring layer when voltage is applied between the second wiring layer and the auxiliary wiring layer,
wherein
the insulated state between the auxiliary wiring layer and either the first wiring layer or the second wiring layer is examined after trimming of the trimming element,
the trimming element is a fusible resistor provided over the semiconductor substrate via an insulating film, and
the middle part has a narrower width than the one end and the other end in a second direction orthogonal to the first direction.

* * * * *